(12) United States Patent
Treur et al.

(10) Patent No.: US 12,183,597 B2
(45) Date of Patent: Dec. 31, 2024

(54) FLUID DELIVERY SYSTEM

(71) Applicant: Ichor Systems, Inc., Fremont, CA (US)

(72) Inventors: Randolph Treur, San Luis Obispo, CA (US); Stephen Carson, Woodstock, NY (US); Michael Vogtmann, Templeton, CA (US)

(73) Assignee: Ichor Systems, Inc.

( * ) Notice: Subject to any disclaimer, the term of this patent is extended or adjusted under 35 U.S.C. 154(b) by 59 days.

(21) Appl. No.: 17/990,872

(22) Filed: Nov. 21, 2022

(65) Prior Publication Data
US 2023/0162993 A1    May 25, 2023

Related U.S. Application Data

(60) Provisional application No. 63/282,761, filed on Nov. 24, 2021.

(51) Int. Cl.
*H01L 21/67* (2006.01)
*F16J 15/06* (2006.01)
*F16L 23/22* (2006.01)

(52) U.S. Cl.
CPC ........ *H01L 21/67017* (2013.01); *F16L 23/22* (2013.01); *F16J 15/062* (2013.01); *Y10T 137/87885* (2015.04)

(58) Field of Classification Search
CPC .............................. F16J 15/062; F16J 15/106
USPC ............ 277/626; 285/139.2, 141.1, 336, 352
See application file for complete search history.

(56) References Cited

U.S. PATENT DOCUMENTS

| | | | | |
|---|---|---|---|---|
| 1,819,036 A | * | 8/1931 | Oberhuber | F16L 23/024 220/240 |
| 2,046,155 A | | 6/1936 | Fantz | |
| 5,466,018 A | * | 11/1995 | Stobbart | F16L 23/167 277/614 |
| 5,839,765 A | | 11/1998 | Carter et al. | |
| 6,161,875 A | | 12/2000 | Yamaji et al. | |

(Continued)

FOREIGN PATENT DOCUMENTS

| | | |
|---|---|---|
| CN | 101255929 | 9/2008 |
| JP | S5947593 | 3/1984 |

(Continued)

OTHER PUBLICATIONS

International Search Report issued in corresponding International Application No. PCT/US22/50548 on Apr. 26, 2023.

(Continued)

*Primary Examiner* — Robert K Arundale
(74) *Attorney, Agent, or Firm* — The Belles Group, P.C.

(57) ABSTRACT

Fluid delivery systems are important component assemblies used for semiconductor fabrication. These fluid delivery systems rely on assemblies of components, requiring seals which must be installed and replaced during assembly and maintenance of the fluid delivery systems. Seals may be arranged as seal rings which engage substrate blocks or active components, the seal rings having seal retention features which aid in assembly. These seal retention features may increase the retention force of the seal in a seal cavity or may reduce the force required to retain the seal. In other arrangements, the seal cavities of the substrate blocks or active components may incorporate seal retention features.

12 Claims, 22 Drawing Sheets

(56) References Cited

U.S. PATENT DOCUMENTS

| | | | |
|---|---|---|---|
| 6,234,545 B1 | 5/2001 | Babuder | |
| 6,415,822 B1 | 7/2002 | Hollingshead | |
| 6,450,507 B2 | 9/2002 | Johnson | |
| 6,546,961 B2 | 4/2003 | Fukushima | |
| 7,320,339 B2 | 1/2008 | Milburn | |
| 7,581,764 B2 | 9/2009 | Ishihara | |
| 8,033,579 B2 * | 10/2011 | Takeda | F16L 23/08 285/112 |
| 8,191,933 B2 * | 6/2012 | Rao | F16J 15/104 285/364 |
| 8,246,087 B1 | 8/2012 | Yamaji et al. | |
| 8,281,816 B2 | 10/2012 | Nakata et al. | |
| 8,336,573 B2 | 12/2012 | Ellis | |
| 8,726,935 B2 | 5/2014 | Leys | |
| 9,488,302 B2 | 11/2016 | Gjerstad et al. | |
| 10,190,708 B2 | 1/2019 | Fujii et al. | |
| 10,704,712 B1 | 7/2020 | Boulanger | |
| 10,927,954 B2 | 2/2021 | Adachi et al. | |
| 11,158,522 B2 | 10/2021 | Melcer et al. | |
| 2002/0017329 A1 | 2/2002 | Fukushima | |
| 2003/0102040 A1 * | 6/2003 | Fukano | F15B 13/0821 137/884 |
| 2005/0241707 A1 | 11/2005 | Harris | |
| 2005/0242519 A1 | 11/2005 | Koleilat et al. | |
| 2006/0011246 A1 | 1/2006 | Leys | |
| 2007/0262581 A1 * | 11/2007 | Ishihara | F16L 23/22 285/10 |
| 2007/0295401 A1 | 12/2007 | Okumura et al. | |
| 2008/0000533 A1 * | 1/2008 | Katsura | F16J 15/061 137/594 |
| 2008/0202614 A1 | 8/2008 | Mamyo et al. | |
| 2008/0295963 A1 | 12/2008 | Moriya et al. | |
| 2008/0296351 A1 | 12/2008 | Crockett et al. | |
| 2009/0126808 A1 * | 5/2009 | Katsura | F16L 39/00 137/594 |
| 2010/0013213 A1 * | 1/2010 | Katsura | F16J 15/062 285/29 |
| 2010/0320699 A1 * | 12/2010 | Takeda | F16L 23/22 277/612 |
| 2011/0260451 A1 * | 10/2011 | Kathol | E21B 33/068 285/335 |
| 2011/0277325 A1 | 11/2011 | Mamyo | |
| 2012/0055555 A1 | 3/2012 | Saint-Paul et al. | |
| 2013/0276928 A1 | 10/2013 | Vu | |
| 2013/0285369 A1 | 10/2013 | Gjerstad et al. | |
| 2015/0176744 A1 * | 6/2015 | Glassman | F16J 15/061 277/609 |
| 2017/0159854 A1 | 6/2017 | Fujii et al. | |
| 2018/0087684 A1 | 3/2018 | Nogari et al. | |
| 2019/0301608 A1 * | 10/2019 | Takeda | F16J 15/10 |
| 2019/0368609 A1 * | 12/2019 | Adachi | F16J 15/062 |
| 2020/0393068 A1 * | 12/2020 | Nakano | F16J 15/104 |
| 2021/0033225 A1 * | 2/2021 | Adachi | F16L 23/22 |
| 2021/0054932 A1 * | 2/2021 | Koike | F16J 15/062 |
| 2021/0159093 A1 * | 5/2021 | Melcer | F16J 15/104 |
| 2021/0193487 A1 | 6/2021 | Melcer et al. | |
| 2021/0317932 A1 * | 10/2021 | Ohmae | F16L 15/04 |
| 2022/0025996 A1 * | 1/2022 | Ohmae | F16L 33/223 |
| 2023/0039578 A1 * | 2/2023 | Kurosaki | F16L 19/05 |
| 2023/0341052 A1 * | 10/2023 | Ohmae | F16K 27/003 |
| 2023/0349492 A1 * | 11/2023 | Ohmae | F16J 15/062 |

FOREIGN PATENT DOCUMENTS

| | | |
|---|---|---|
| JP | H07504481 | 5/1995 |
| JP | H9-264440 | 10/1997 |
| JP | H11118054 | 4/1999 |
| JP | H11280967 | 10/1999 |
| JP | 2000-146051 | 5/2000 |
| JP | 2002-048299 A | 2/2002 |
| JP | 2003-322127 | 11/2003 |
| JP | 2005-140230 | 6/2005 |
| JP | 2005-240989 | 9/2005 |
| JP | 2005-326005 | 11/2005 |
| JP | 2006-022926 | 1/2006 |
| JP | 2006-046502 | 2/2006 |
| JP | 2006-132662 | 5/2006 |
| JP | 2006153180 | 6/2006 |
| JP | 2006307983 | 11/2006 |
| JP | 2007-024307 | 2/2007 |
| JP | 2007-139196 | 6/2007 |
| JP | 2007-292217 | 11/2007 |
| JP | 2008-039100 | 2/2008 |
| JP | 2008-105401 | 5/2008 |
| JP | 2008-210982 | 9/2008 |
| JP | 2010-017939 | 1/2010 |
| JP | 2010-203533 | 9/2010 |
| JP | 2011503449 | 1/2011 |
| JP | 2011-149554 | 8/2011 |
| JP | 2015-078928 | 4/2015 |
| JP | 5883907 | 3/2016 |
| JP | 2016-070386 | 5/2016 |
| JP | 201670388 | 5/2016 |
| JP | 2016-136637 | 7/2016 |
| WO | WO2006/059362 A2 | 6/2006 |
| WO | WO2017/176815 | 10/2017 |
| WO | WO2019/176259 | 9/2019 |
| WO | WO2019/187504 | 10/2019 |

OTHER PUBLICATIONS

Written Opinion of the International Searching Authority issued in corresponding International Application No. PCT/US22/05048 on Apr. 26, 2023.

* cited by examiner

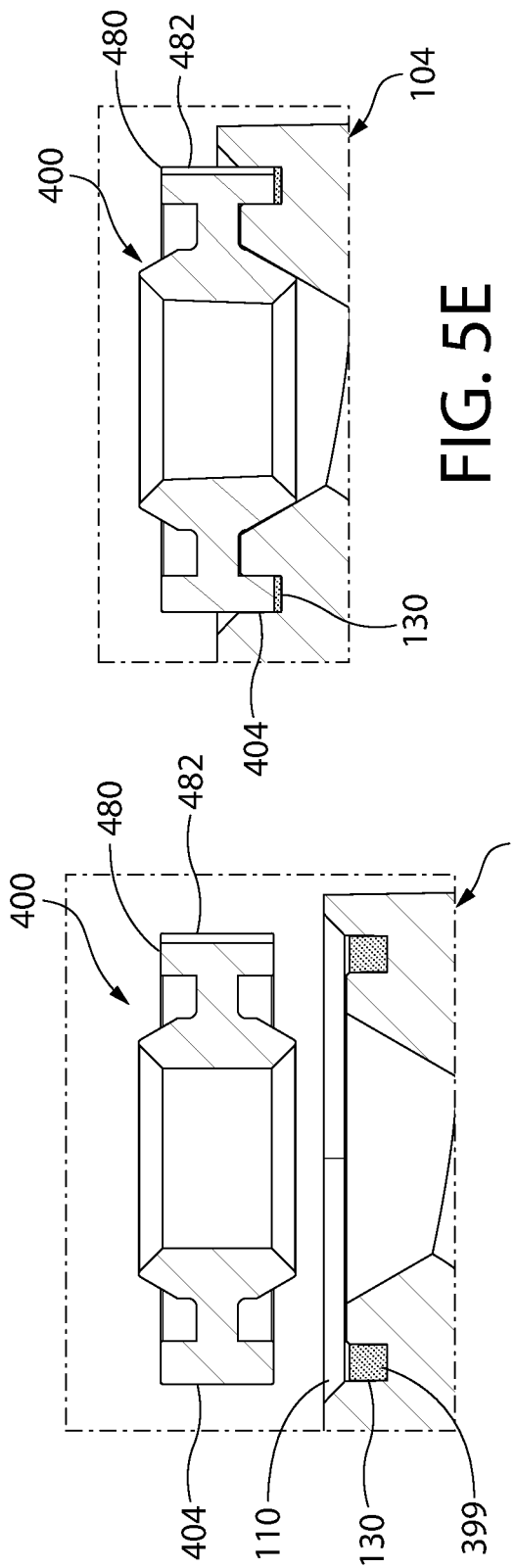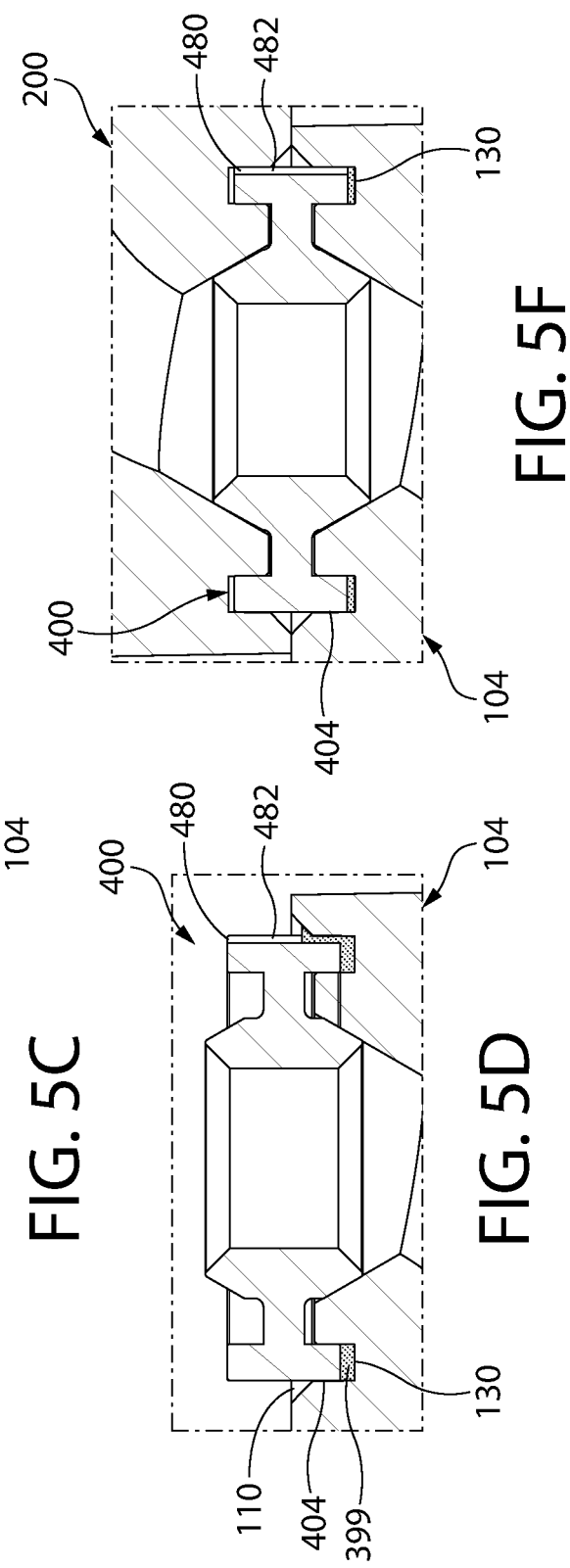

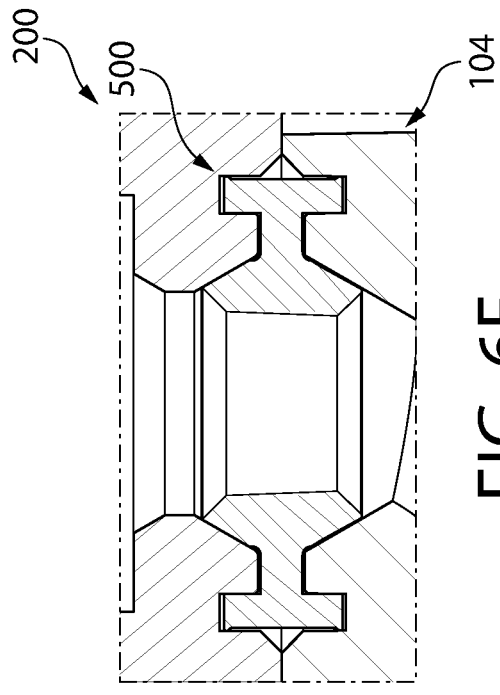
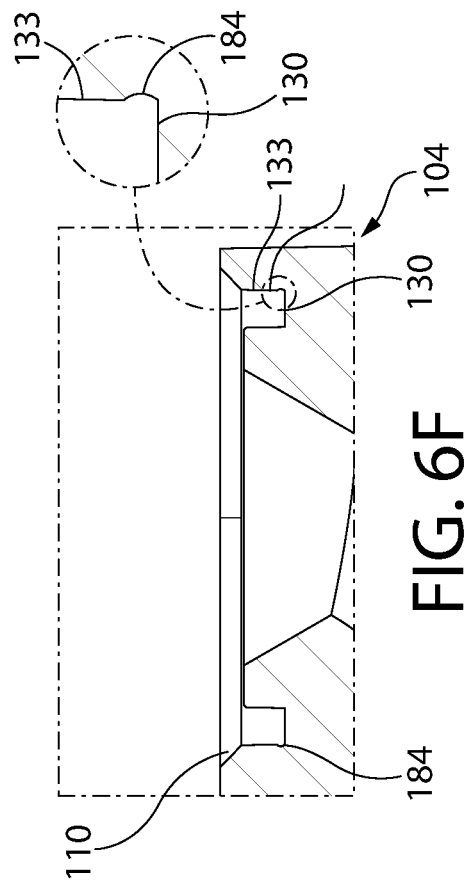
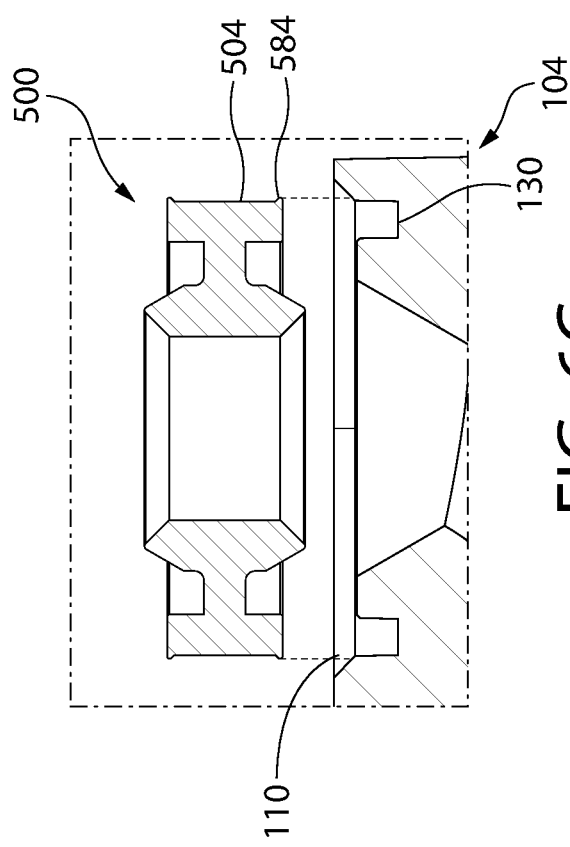
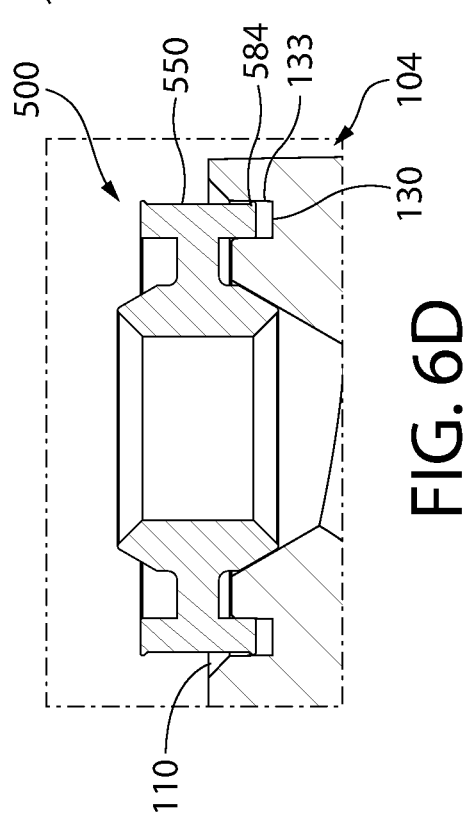

FLUID DELIVERY SYSTEM

CROSS-REFERENCE TO RELATED APPLICATIONS

This application claims the benefit of U.S. Provisional Application 63/282,761, filed Nov. 24, 2021, which is incorporated herein by reference in its entirety.

BACKGROUND OF THE INVENTION

Fluid delivery is a key component of semiconductor chip fabrication tools. Fluid delivery systems are important for delivering known flow rates of process fluids for semiconductor fabrication and other industrial processes. Such devices are used to measure and accurately control the flow of a wide range of fluids for a variety of applications. This control relies on assemblies of active and passive components which are sealed by seals to provide fluid-tight connections.

As the technology of chip fabrication has improved, so has the demand on the fluid delivery systems. Higher performance fluid delivery systems are packaged with higher densities, require higher performing seals, and must be serviced more efficiently. Time to assemble and service fluid delivery systems must be reduced. Ease of service and assembly of fluid delivery systems is of utmost importance. In order to deliver superior process performance, improved fluid delivery systems are desired.

SUMMARY OF THE INVENTION

The present technology is directed to a fluid delivery system incorporating one or more apparatuses for controlling flow to deliver a gas or a liquid to a process chamber. The fluid delivery system may be used in a wide range of processes such as semiconductor chip fabrication, solar panel fabrication, etc.

In one implementation, the invention is a fluid delivery system having a substrate block, an active component, and a seal ring. The substrate block has an upper surface, a first substrate port in the upper surface, a second substrate port in the upper surface, a substrate fluid passageway extending between the first substrate port and the second substrate port, a substrate ring defining the second substrate port, and a substrate seal channel formed in the upper surface and surrounding the substrate ring, an outer surface of the substrate ring forming an inner surface of the substrate seal channel. The active component has a lower surface, a first component port in the lower surface, a component fluid passageway extending from the first component port, a component ring defining the first component port, and a component seal channel formed in the lower surface and surrounding the component ring, an outer surface of the component ring forming an inner surface of the component seal channel. The seal ring has an interior sleeve defining a sleeve fluid passageway and an outer ring connected to and surrounding the interior sleeve so that an annular upper sleeve groove is formed between the upper portion of the outer ring and an upper ring of the interior sleeve. The outer ring of the seal ring further has an annular lower sleeve groove formed between a lower portion of the outer ring and a lower portion of the interior sleeve, the outer ring having an inner surface, an outer surface, and a seal retention feature. The seal retention feature is formed on the outer surface of the outer ring. The active component is mounted to the substrate block so that the second substrate port and the first component port are aligned and the seal ring nests in each of the substrate seal channel and the component seal channel and the seal ring fluidly seals the substrate fluid passageway and the component fluid passageway.

In another aspect, the invention is a seal ring having an interior sleeve and an outer ring. The interior sleeve defines a sleeve fluid passageway and the outer ring is connected to and surrounding the interior sleeve so that an annular upper sleeve groove is formed between an upper portion of the outer ring and an upper portion of the interior sleeve and an annular lower sleeve groove is formed between a lower portion of the outer ring and a lower portion of the interior sleeve. The outer ring has an inner surface, an outer surface, and a seal retention feature, the seal retention feature formed on the outer surface of the outer ring.

In yet another implementation, the invention is a method of assembling a fluid delivery system. In step a), a substrate block is provided, the substrate block having an upper surface, a first substrate port in the upper surface, a second substrate port in the upper surface, a substrate fluid passageway extending between the first substrate port and the second substrate port, a substrate ring defining the second substrate port, and a substrate seal channel formed in the upper surface and surrounding the substrate ring, an outer surface of the substrate ring forming an inner surface of the substrate seal channel. In step b), a seal ring is inserted into the first substrate port in the upper surface of the substrate block, the seal ring having an interior sleeve defining a sleeve fluid passageway and an outer ring, the outer ring connected to and surrounding the interior sleeve so that an annular upper sleeve groove is formed between an upper portion of the outer ring and an upper portion of the interior sleeve and an annular lower sleeve groove is formed between a lower portion of the outer ring and a lower portion of the interior sleeve, the outer ring comprising an inner surface, an outer surface, and a seal retention feature, the seal retention feature formed on the outer surface of the outer ring, the seal annular lower sleeve groove receiving the substrate ring of the first substrate port. In step c), an active component is coupled to the substrate block, the active component having a lower surface, a first component port in the lower surface, a component fluid passageway extending from the first component port, a component ring defining the first component port, and a component seal channel formed in the lower surface and surrounding the component ring, an outer surface of the component ring forming an inner surface of the component seal channel, the annular upper sleeve groove of the seal ring receiving the component ring of the active component.

In another implementation, the invention is a fluid delivery system having a substrate block, an active component, and a seal ring. The substrate block has an upper surface, a first substrate port in the upper surface, a second substrate port in the upper surface, a substrate fluid passageway extending between the first substrate port and the second substrate port, a substrate ring defining the second substrate port, a substrate seal channel formed in the upper surface and surrounding the substrate ring, an outer surface of the substrate ring forming an inner surface of the substrate seal channel, and a substrate seal retention feature formed on an outer surface of the substrate seal channel, the outer surface opposite the inner surface of the substrate seal channel. The active component has a lower surface, a first component port in the lower surface, a component fluid passageway extending from the first component port, a component ring defining the first component port, and a component seal channel formed in the lower surface and surrounding the component ring, an outer surface of the component ring forming an inner surface of the component seal channel. The seal ring has an interior sleeve defining a sleeve fluid passageway and an outer ring connected to and surrounding the interior sleeve so that an annular upper sleeve groove is formed between the upper portion of the outer ring and an upper ring of the interior sleeve. The outer ring of the seal ring further has an annular lower sleeve groove formed between a lower portion of the outer ring and a lower portion of the interior sleeve. The active component is mounted to the substrate block so that the second substrate port and the first component port are aligned and the seal ring nests in each of the substrate seal channel and the component seal channel and the seal ring fluidly seals the substrate fluid passageway and the component fluid passageway.

In yet another implementation, the invention is a method of assembling a fluid delivery system. In step a), a substrate block is provided, the substrate block having an upper surface, a first substrate port in the upper surface, a second substrate port in the upper surface, a substrate fluid passageway extending between the first substrate port and the second substrate port, a substrate ring defining the second substrate port, a substrate seal channel formed in the upper surface and surrounding the substrate ring, an outer surface of the substrate ring forming an inner surface of the substrate seal channel, and a substrate seal retention feature formed on an outer surface of the substrate seal channel, the outer surface opposite the inner surface of the substrate seal channel. In step b), a seal ring is inserted into the first substrate port in the upper surface of the substrate block, the seal ring comprising an interior sleeve defining a sleeve fluid passageway and an outer ring, the outer ring connected to and surrounding the interior sleeve so that an annular upper sleeve groove is formed between an upper portion of the outer ring and an upper portion of the interior sleeve and an annular lower sleeve groove is formed between a lower portion of the outer ring and a lower portion of the interior sleeve, the seal annular lower sleeve groove receiving the substrate ring of the first substrate port. In step c), an active component is coupled to the substrate block, the active component comprising a lower surface, a first component port in the lower surface, a component fluid passageway extending from the first component port, a component ring defining the first component port, and a component seal channel formed in the lower surface and surrounding the component ring, an outer surface of the component ring forming an inner surface of the component seal channel, the annular upper sleeve groove of the seal ring receiving the component ring of the active component.

Further areas of applicability of the present technology will become apparent from the detailed description provided hereinafter. It should be understood that the detailed description and specific examples, while indicating the preferred implementation, are intended for purposes of illustration only and are not intended to limit the scope of the technology.

BRIEF DESCRIPTION OF THE DRAWINGS

The invention of the present disclosure will become more fully understood from the detailed description and the accompanying drawings, wherein:

FIG. 5C is a detail view of the seal ring of FIG. 5A and a portion of a substrate block, the seal ring positioned above a seal cavity of the substrate block.

FIG. 5D is a detail view of the seal ring and the portion of the substrate block shown in FIG. 5C, the seal ring partially inserted into the seal cavity of the substrate block.

FIG. 5E is a detail view of the seal ring and the portion of the substrate block shown in FIG. 5C, the seal ring fully inserted into the seal cavity of the substrate block.

FIG. 5F is a detail view of the seal ring and the portion of the substrate block shown in FIG. 5C, an active component coupled to the substrate block.

FIG. 6C is a detail view of the seal ring of FIG. 6A and a portion of a substrate block, the seal ring positioned above a seal cavity of the substrate block.

FIG. 6D is a detail view of the seal ring and the portion of the substrate block shown in FIG. 6C, the seal ring partially inserted into the seal cavity of the substrate block.

FIG. 6E is a detail view of the seal ring and the portion of the substrate block shown in FIG. 6C, the seal ring fully inserted into the seal cavity of the substrate block and an active component coupled to the substrate block.

FIG. 6F is a detail view of the portion of the substrate block shown in FIG. 6C, the seal ring removed from the substrate block.

Figure 1:
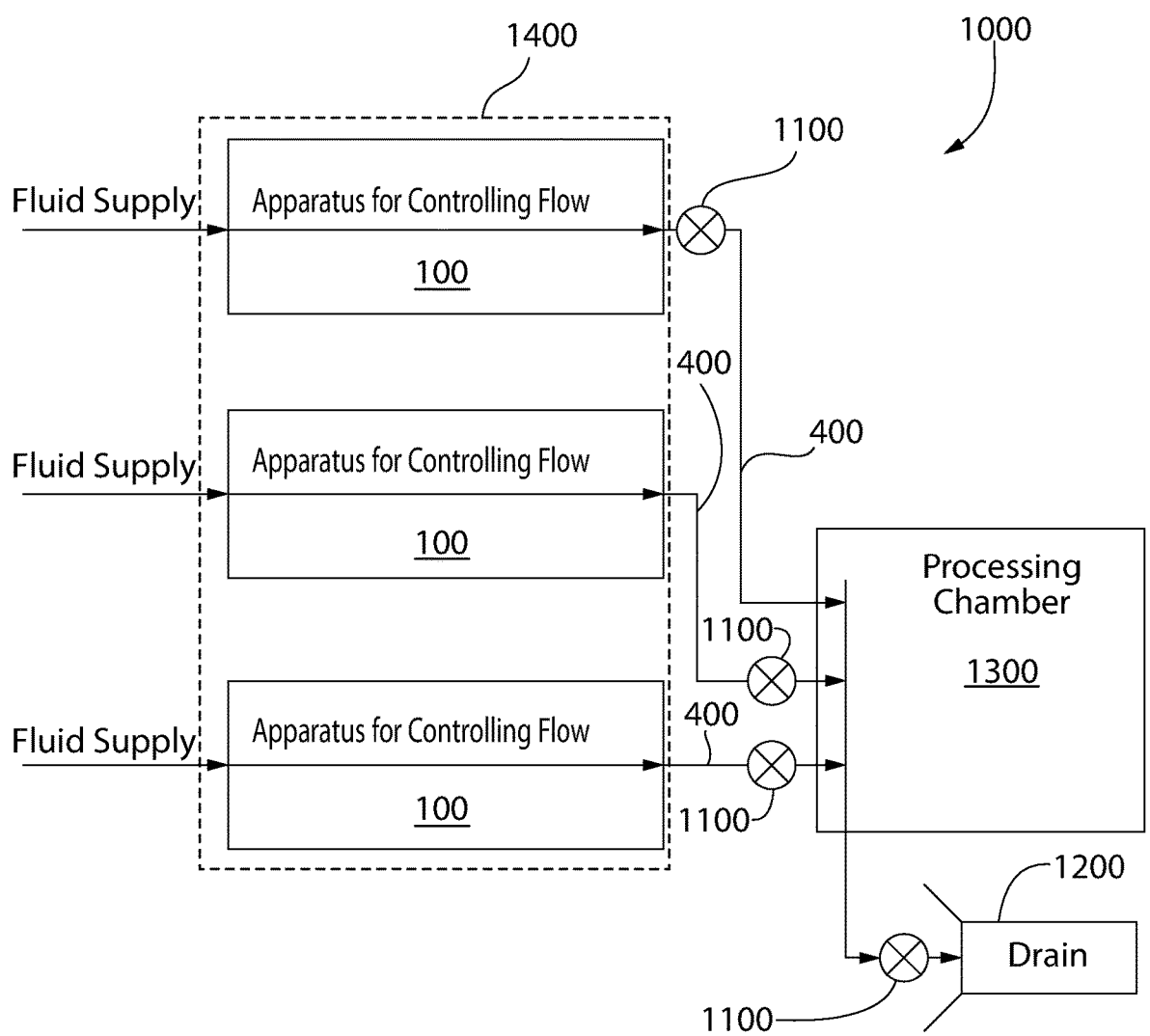
FIG. 1 is a schematic of a system for manufacturing semiconductor devices utilizing one or more apparatuses for controlling flow.

All drawings are schematic and not necessarily to scale. Features shown numbered in certain figures which may appear un-numbered in other figures are the same features unless noted otherwise herein.

DETAILED DESCRIPTION

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combinations of features that may exist alone or in other combinations of features; the scope of the invention being defined by the claims appended hereto.

The present invention is directed to a fitting assembly for use in a fluid delivery system comprising at least one apparatus for controlling fluid flow. In some embodiments, the fluid delivery system may include a mass flow controller to deliver a known mass flow of fluid to a semiconductor process or similar process. Semiconductor fabrication is one industry which demands high performance in control of fluid flows. As semiconductor fabrication techniques have advanced, customers have recognized the need for flow control devices with increased complexity and capability. Modern semiconductor processes require that the cost of the fluid delivery systems is reduced and parts interchangeability is maximized. The present invention provides for a modular fitting assembly which can be utilized in a variety of applications within the fluid delivery system.

FIG. 1 shows a schematic of an exemplary processing system 1000. The processing system 1000 may utilize a plurality of apparatus for controlling flow 100 fluidly coupled to a processing chamber 1300. The plurality of apparatus for controlling flow 100 are used to supply one or more different process fluids to the processing chamber 1300. Fluids are provided by a plurality of fluid supplies, or fluid sources. Collectively, the plurality of apparatus for controlling flow 100 belong to a fluid delivery system 1400. Optionally, more than one fluid delivery system 1400 may be utilized in the processing system 100. The plurality of apparatus for controlling flow 100 are connected to the processing chamber 1300 by an outlet manifold 400. Articles such as semiconductors and integrated circuits may be processed within the processing chamber 1300.

Valves 1100 isolate each of the apparatus for controlling flow 100 from the processing chamber 1300, enabling each of the apparatus for controlling flow 100 to be selectively connected or isolated from the processing chamber 1300, facilitating a wide variety of different processing steps. The processing chamber 1300 may contain an applicator to apply process fluids delivered by the plurality of apparatus for controlling flow 100, enabling selective or diffuse distribution of the fluids supplied by the plurality of apparatus for controlling flow 100. Optionally, the processing chamber 1300 may be a vacuum chamber or may be a tank or bath for immersing articles in the fluids supplied by the plurality of apparatus for controlling flow 100. A fluid supply line is formed by the flow path from each of the respective fluid supplies to the processing chamber 1300.

In addition, the processing system 1000 may further comprise a drain 1200 which is isolated from the processing chamber 1300 by a valve 1100 to enable evacuation of process fluids or facilitate purging one or more of the apparatus for controlling flow 100 to enable switching between process fluids in the same apparatus for controlling flow 100. Optionally, the drain 1200 may be a source of vacuum or may be a liquid drain configured to remove liquids from the processing chamber 1300. Optionally, the apparatus for controlling flow 100 may be mass flow controllers, flow splitters, or any other device which controls the flow of a process fluid in a processing system. Furthermore, the valves 1100 may be integrated into the apparatus for controlling flow 100 if so desired.

Processes that may be performed in the processing system 1000 may include wet cleaning, photolithography, ion implantation, dry etching, atomic layer etching, wet etching, plasma ashing, rapid thermal annealing, furnace annealing, thermal oxidation, chemical vapor deposition, atomic layer deposition, physical vapor deposition, molecular beam epitaxy, laser lift-off, electrochemical deposition, chemical-mechanical polishing, wafer testing, electroplating, or any other process utilizing fluids.

Figure 2:
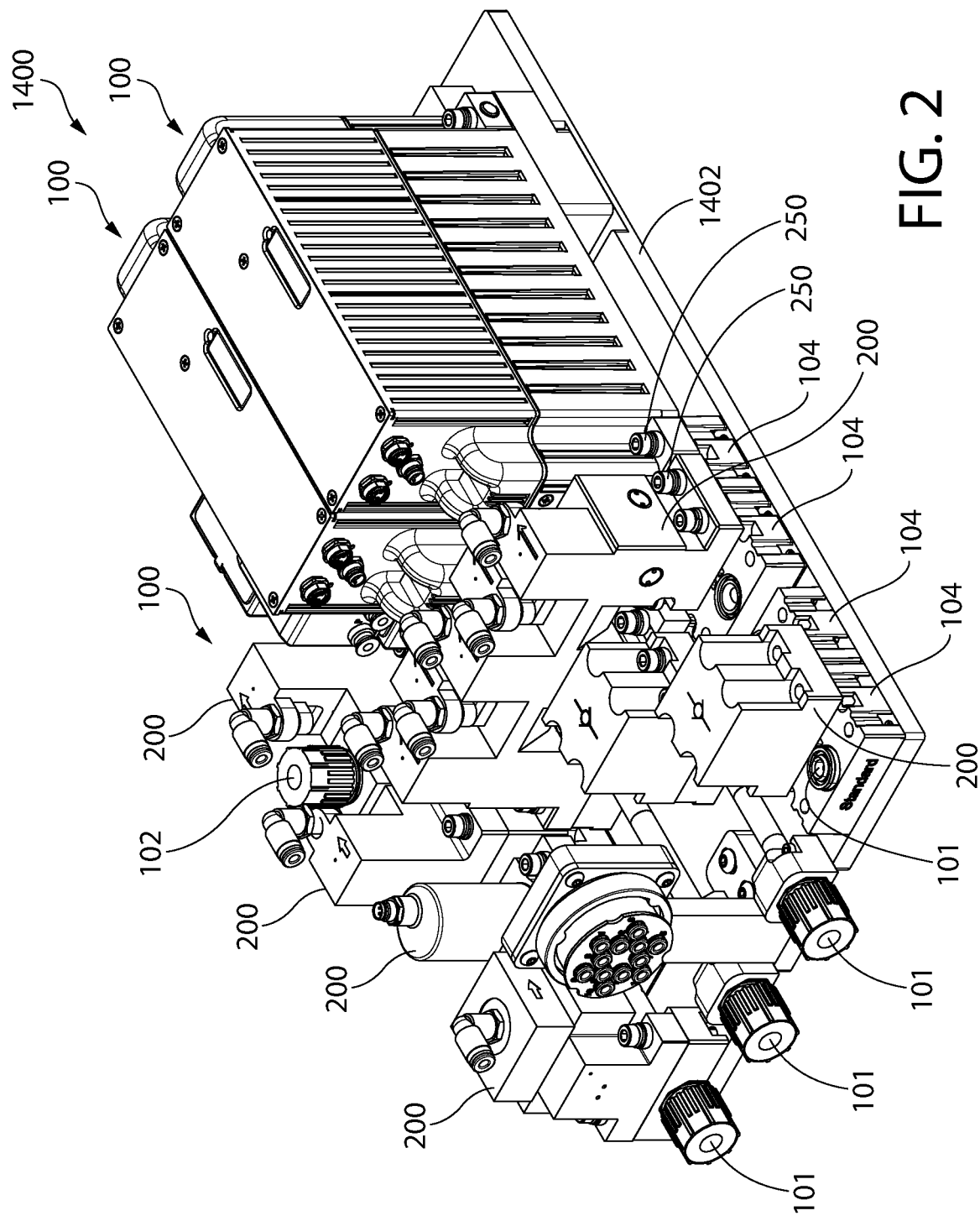
FIG. 2 is a perspective view of a fluid delivery system comprising a plurality apparatuses for controlling flow as may be utilized in the process of FIG. 1.
Figure 3:
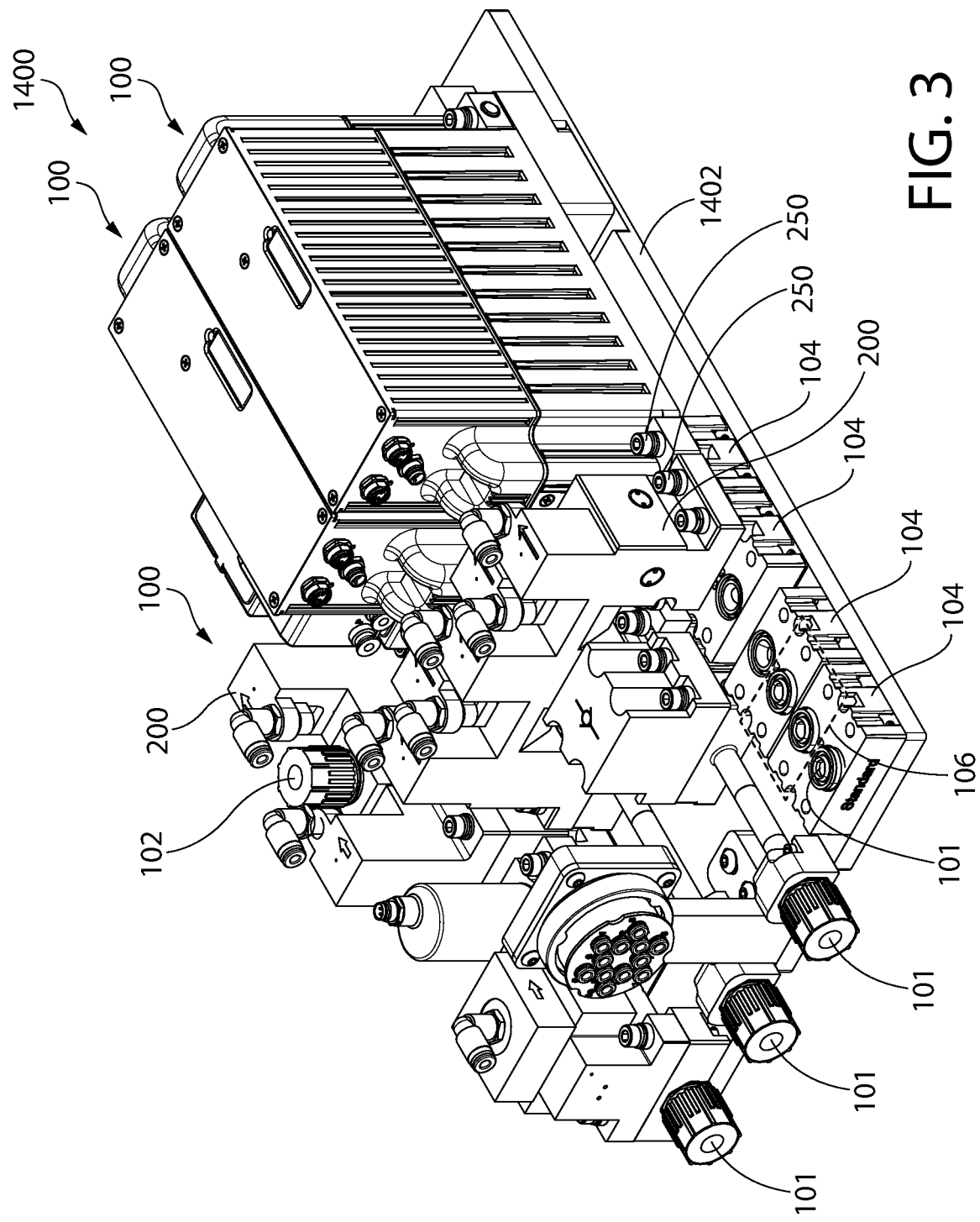
FIG. 3 is a perspective view of the fluid delivery system of FIG. 2 showing one fluid flow component removed.

FIGS. 2 and 3 show a schematic of an exemplary fluid delivery system 1400. In this embodiment, the fluid delivery system 1400 has a plurality of apparatus for controlling flow 100 having a plurality of inlets 101 and a plurality of outlets 102. In some embodiments, the plurality of inlets 101 do not correspond to the plurality of outlets 102 in a one to one manner. Instead, a plurality of inlets 101 may be joined into a single outlet 102 and a single inlet 101 may be split into a plurality of outlets 102. This may be done to achieve mixing or combination of different fluids prior to providing them to the process chamber 1300. Nonetheless, at least one flow passage extends from one of the inlets 101 to one of the outlets 102, the flow passage being formed by the various components of the fluid delivery system 1400.

As can be seen, each of the apparatus for controlling flow 100 is arranged generally in a row, with the plurality of apparatus 100 in parallel rows. This need not be the case, and any packaging configuration may be used. The fluid delivery system 1400 has a substrate panel 1402. The substrate panel 1402 serves as support structure for the fluid delivery system 1400, but it may be simply used to facilitate assembly. Other structural support configurations are contemplated. A plurality of substrate blocks 104 rest on the substrate panel 1402 and comprise fluid ports therein to conduct flow to one or more fluid flow components 200 having corresponding fluid ports as discussed in greater detail below. The fluid flow components 200 may be considered active components while the substrate blocks 104 may be considered passive components.

The fluid flow components 200 may be one or more of a valve, a flow controller, a pressure transducer, a flow measurement sensor, a pressure regulator, a flow restrictor, an actuator, an inlet 101 or outlet 102, or any other known flow control component. In other embodiments, the substrate blocks 104 may be utilized on the top and the fluid flow components 200 may rest against the substrate panel 1402. This may be done to enhance packaging efficiency, enable greater flexibility in design of an apparatus for controlling flow 100, or for other reasons. Substrate blocks 104 need not necessarily be in contact with the substrate panel 1402, but are referred to as substrate blocks for the sake of explanation with the understanding that the names of the respective components do not necessarily indicate their position or orientation.

A plurality of anchors are used to couple the fluid flow components 200 to the substrate blocks 104. The anchors may be threaded inserts or threads in the substrate blocks 104, threaded inserts or threads in the substrate panel 1402, nuts, or other anchoring features which permit secure fastening of the fluid flow components 200. Component fasteners 250 are used to secure fluid flow components 200 to substrate blocks 104. Optionally, the component fasteners 250 extend through the substrate blocks 104 to attach the fluid flow components 200 and the substrate blocks 104 to the substrate panel 1402. In alternate configurations, additional fasteners are used to secure the substrate blocks 104 to the substrate panel 1402. The component fasteners 250 may be used for alignment as well as for fastening and may be replaced by any suitable type of fastener capable of fastening the fluid flow components 200 to the substrate blocks 104. The component fasteners 250 may be fasteners such as bolts, screws, pins, or other known fastening device. However, in other embodiments, the component fasteners 250 may be separate from the alignment features. For instance, dowel pins or other pins may be used to align the fluid flow component 200 to the substrate blocks 104. Then, a separate component fastener may be used for fastening the fluid flow component 200 to the substrate blocks 104.

As can be seen by comparing FIG. 2 with FIG. 3, a fluid flow component 200 is removed from the fluid delivery system 1400 of FIG. 3. The removal of the fluid flow component 200 exposes portions of two substrate blocks 104. A component mounting location 106 is formed by the portions of the two substrate blocks 104. The component mounting location 106 may vary in size depending on the dimensions of the component 200 mounted to the component mounting location 106. Thus, different component mounting locations 106 may comprise different portions of the same substrate block 104. Each and every component 200 has a component mounting location 106 in the fluid delivery system 1400. More than two substrate blocks 104 may be utilized to form a component mounting location 106. Alternatively, only one substrate block 104 may be utilized to form a component mounting location 106. This will depend on the type of component 200 which is mounted to the component mounting location 106.

Figure 4A:
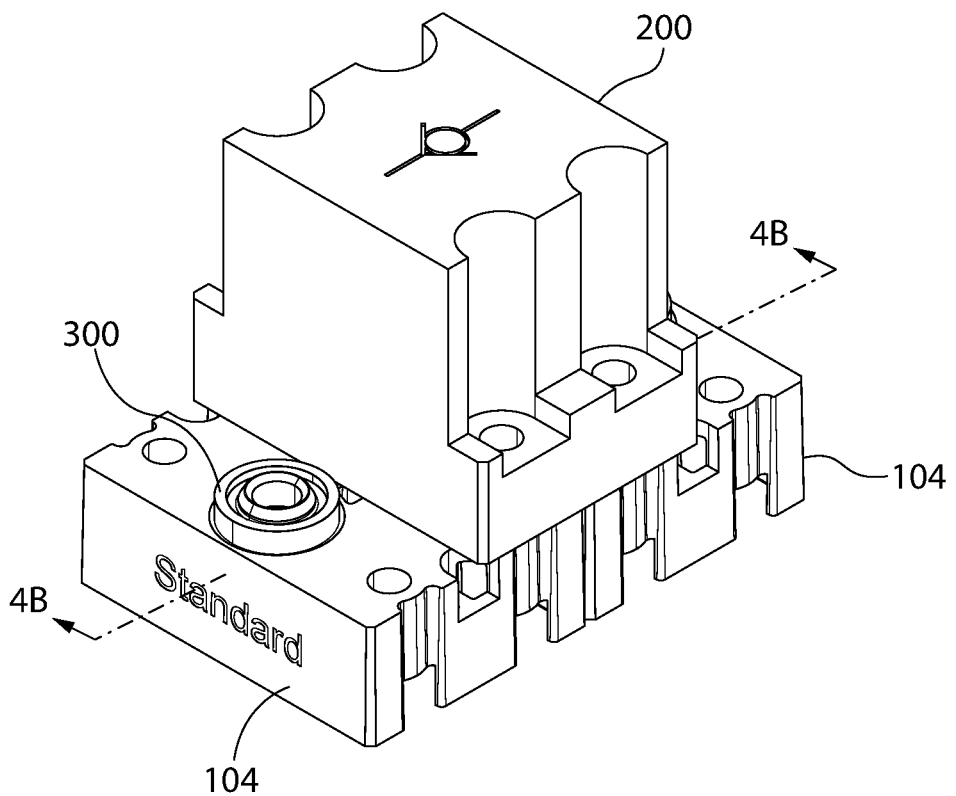
FIG. 4A is a perspective view of an active component mounted to a pair of substrate blocks as may be utilized in the fluid delivery system of FIG. 2.
Figure 4B:
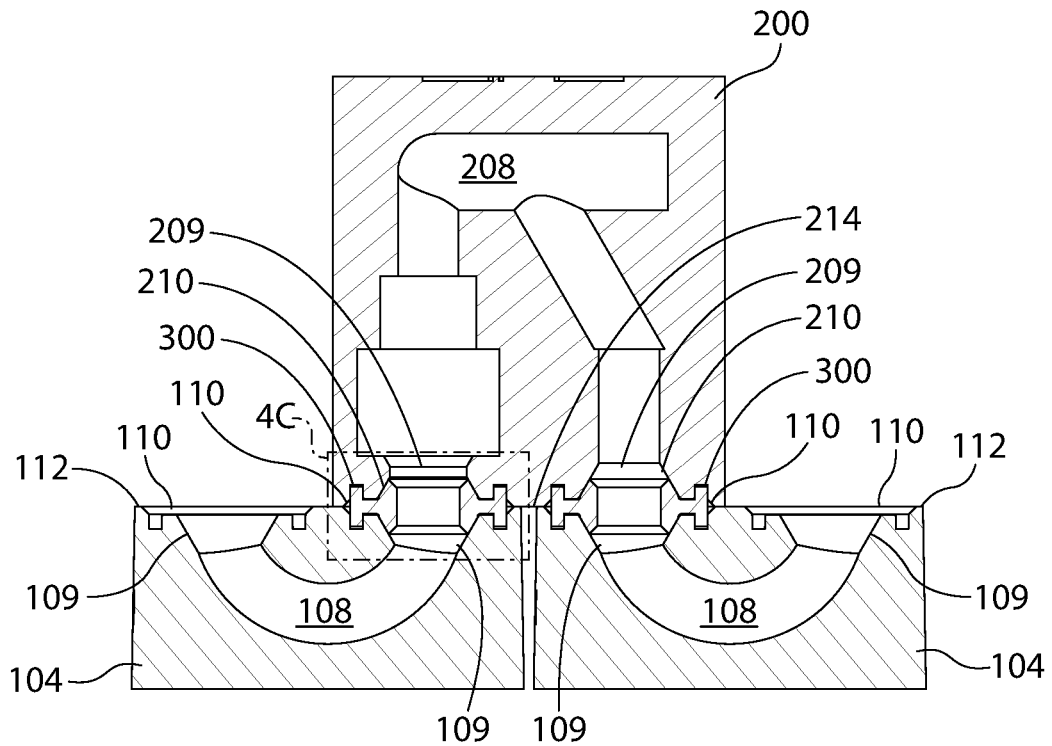
FIG. 4B is a cross-sectional view of the component and one of the substrate blocks of FIG. 4A, taken along line 4B-4B.

Turning to FIGS. 4A-D, a portion of the fluid delivery system 1400 is shown. Specifically, a fluid flow component 200 is shown mounted to a pair of substrate blocks 104 at a component location 106. As best shown in FIG. 4B, seal rings 300 are positioned between the fluid flow component 200 and the substrate blocks 104. The seal rings 300 form a fluid-tight connection between the fluid flow component 200 and the substrate blocks 104. The substrate blocks 104 each comprise a fluid passageway 108 extending from a first substrate port 109 to a second substrate port 109. Each of the first substrate ports 109 are formed in an upper surface 112 of the substrate block 104. Similarly, the fluid flow component 200 comprises a fluid passageway 208 extending from a first component port 209 formed in a lower surface 214 to a second component port 209 formed in the lower surface 214. The substrate ports 109 of the substrate blocks 104 are surrounded by seal cavities 110 which receive a seal ring 300. The component ports 209 of the fluid flow component 200 are surrounded by seal cavities 210 which receive a seal ring 300.

The seal ring 300 is formed in a generally annular configuration, with an interior sleeve 302 and an outer ring 304. The interior sleeve 302 of the seal ring 300 has a sleeve fluid passageway 308 formed through the center of the seal ring 300. The sleeve fluid passageway 308 extends along a longitudinal axis A-A. The interior sleeve 302 and the outer ring 304 are symmetrical about the longitudinal axis A-A. The sleeve fluid passageway 308 permits fluid flow through the seal ring 300 and other features of the seal ring 300 provide a hermetic seal between coupled fluid flow components 200 and substrate blocks 104. In some embodiments, the interior sleeve 302 and the outer ring 304 may not be symmetrical about the longitudinal axis A-A.

Figure 4C:
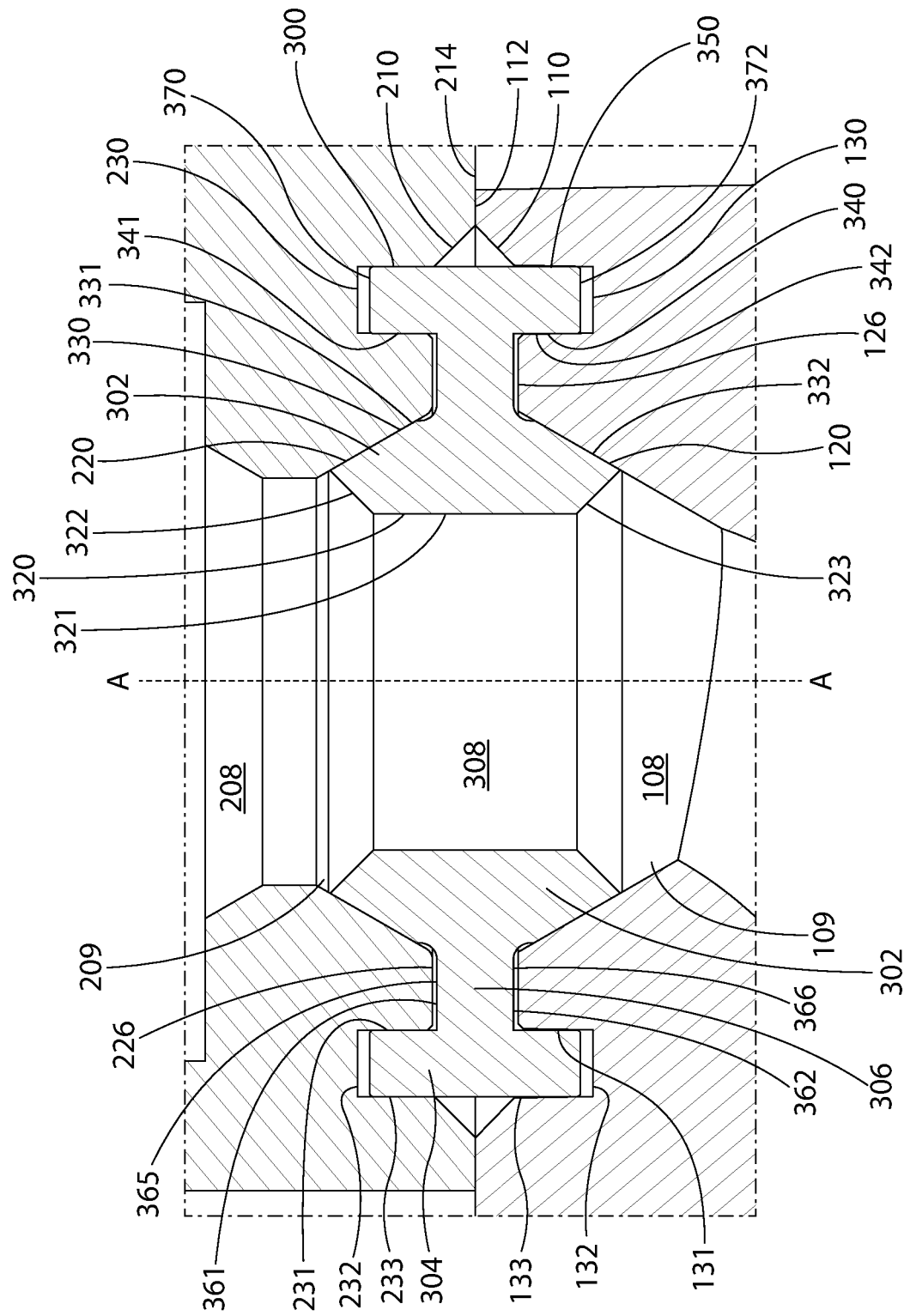
FIG. 4C is a detail view of FIG. 4A showing an interface between the component and one of the substrate blocks.
Figure 4D:
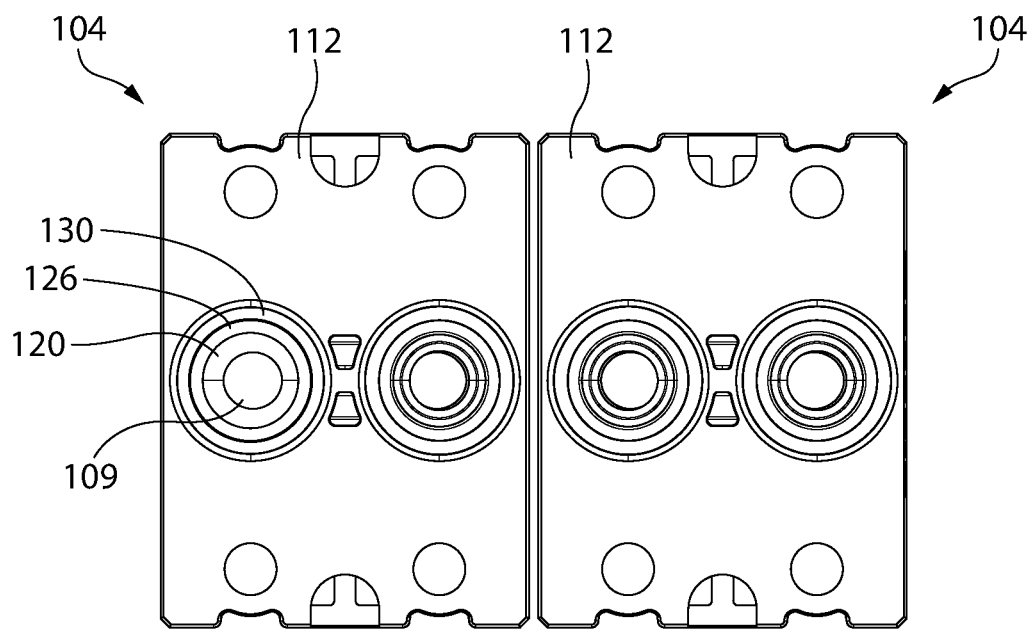
FIG. 4D is a top view of the substrate blocks of FIG. 4A.
Figure 4E:
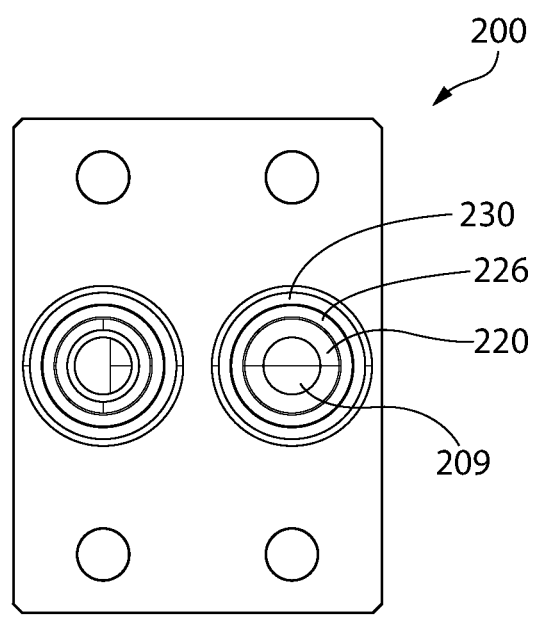
FIG. 4E is a bottom view of the component of FIG. 4A.

The interior sleeve 302 comprises an passageway surface 320 which forms the wall of the sleeve fluid passageway 308. The passageway surface 320 comprises an intermediate surface 321, an upper inclined surface 322, and a lower inclined surface 323. The upper inclined surface 322 joins the component port 209 to the sleeve fluid passageway 308. The lower inclined surface 323 joins the substrate port 109 to the sleeve fluid passageway 308. The intermediate surface 321 couples the upper and lower inclined surfaces 322, 323. The upper and lower inclined surfaces 322, 323 may have a linear profile (i.e. a straight line with constant slope) as shown in FIGS. 4B and 4C or may have a curved profile. The curved profile may be convex, concave, or any other desired shape. Similarly, the intermediate surface 321 may be linear and parallel to the longitudinal axis, linear and sloped with respect to the longitudinal axis, or curved in a convex or concave profile.

The interior sleeve 302 also comprises a first mating surface 330 which engages corresponding features in the seal cavities 110, 210 of the substrate block 104 and the fluid flow component 200 as will be discussed in greater detail below. The first mating surface 330 comprises an upper mating surface 331 and a lower mating surface 332. The upper mating surface 331 engages features of the seal cavity 210 of the fluid flow component 200 while the lower mating surface 332 engages features of the seal cavity 110 of the substrate block 104. The upper and lower mating surfaces 331, 332 may have a linear geometry, a convex geometry, or a concave geometry. In the present embodiment, the upper and lower mating surfaces 331, 332 have a linear geometry.

The outer ring 304 has an inner surface 340 and an outer surface 350. The inner surface 340 is proximate the interior sleeve 302 and faces the first mating surface 330. The outer surface 350 is opposite the inner surface 340. The inner surface 340 may be divided into an upper inner surface 341 and a lower inner surface 342.

The interior sleeve 302 is joined to the outer ring 304 by a web 306, the web 306 separating the upper and lower inner surfaces 341, 342 and the upper and lower mating surfaces 331, 332. The web 306 has an upper web surface 361 and a lower web surface 362. The upper web surface 361, along with the upper inner surface 341 of the inner surface 340 outer ring 304 and the upper mating surface 331 of the first mating surface 330, form an annular upper sleeve groove 365. Similarly, the lower web surface 362, along with the lower inner surface 342 of the inner surface 340 of the outer ring 304 and the lower mating surface 332 of the first mating surface 330, form an annular lower sleeve groove 366. The outer ring 304 further comprises an upper terminal surface 370 and a lower terminal surface 372.

The seal cavities 110 of the substrate block 104 surround the substrate ports 109 as discussed above. The seal cavities 110 comprise a second mating surface 120, a substrate ring 126, and a substrate seal channel 130. The second mating surface 120 forms a portion of the substrate port 109 and receives the lower mating surface 332 of the first mating surface 330 of the seal ring 300. The second mating surface 120 is linear and angled with respect to the longitudinal axis A-A. However, in other embodiments the second mating surface 120 may be convex or concave or any other geometry. The second mating surface 120 may be formed as a separate surface from the substrate port 109 in alternate embodiments.

The substrate ring 126 defines the substrate port 109. The substrate port 109 terminates at the substrate ring 126 and is surrounded by the substrate ring 126. The substrate ring 126 is recessed with respect to the upper surface 112 of the substrate block 104. Surrounding the substrate ring 126 is the substrate seal channel 130. The substrate seal channel 130 is recessed with respect to the substrate ring 126 and the upper surface 112 of the substrate block 104. Thus, the substrate ring 126 protrudes above the substrate seal channel 130. The substrate ring 126 may have any desired geometry. The substrate seal channel 130 has a channel inner surface 131, a channel floor 132, and a channel outer surface 133. The channel inner surface 131 is adjacent to the substrate ring 126 and forms an outer surface of the substrate ring 126. The channel outer surface 133 is opposite the channel inner surface 133 and is radially outward from the channel inner surface 131. The channel floor 132 joins the channel inner surface 131 and the channel outer surface 133.

The seal cavities 210 of the fluid flow component 200 surround the component ports 209 as discussed above. The seal cavities 210 comprise a second mating surface 220, a component ring 226, and a component seal channel 230. The second mating surface 220 forms a portion of the component port 209 and receives the upper mating surface 331 of the first mating surface 330 of the seal ring 300. The second mating surface 220 is linear and angled with respect to the longitudinal axis A-A. However, in other embodiments the second mating surface 220 may be convex or concave or any other geometry. The second mating surface 220 may be formed as a separate surface from the component port 209 in alternate embodiments.

The component ring 226 defines the component port 209. The component port 209 terminates at the component ring 226 and is surrounded by the component ring 226. The component ring 226 is recessed with respect to the lower surface 214 of the fluid flow component 200. Surrounding the component ring 226 is the component seal channel 230. The component seal channel 230 is recessed with respect to the component ring 226 and the lower surface 214 of the fluid flow component 200. Thus, the component ring 226 protrudes below the component seal channel 230. The component ring 226 may have any desired geometry. The component seal channel 230 has a channel inner surface 231, a channel floor 232, and a channel outer surface 233. The channel inner surface 231 is adjacent to the component ring 226 and forms an outer surface of the component ring 226. The channel outer surface 233 is opposite the channel inner surface 231 and is radially outward from the channel inner surface 231. The channel floor 232 joins the channel inner surface 231 and the channel outer surface 233.

When in an assembled state as illustrated in FIG. 4C, the channel inner surfaces 131, 231 engage the inner surface 340 of the seal ring 300 while the channel outer surfaces 133, 233 engage the outer surface 350 of the seal ring 300. In particular, the channel inner surface 131 engages the lower inner surface 342 of the seal ring 300. The channel inner surface 231 engages the upper inner surface 341 of the seal ring 300. Thus, the outer ring 304 is radially compressed by the substrate seal channel 130 and the component seal channel 230. The upper and lower terminal surfaces 370, 372 are spaced from the channel floors 132, 232. Similarly, the upper web surface 361 is spaced from the component ring 226 and the lower web surface 362 is spaced from the substrate 126. This beneficially ensures that the first and second mating surfaces 330, 120, 220 are in contact without being over-constrained. As a result, the interface between the first and second mating surfaces 330, 120, 220 form a first seal. The interface between the channel inner surfaces 131, 231 and the inner surface 340 of the seal ring 300 form a second seal. The interface between the channel outer surfaces 133, 233 and the outer surface 350 form a third seal. This provides protection against leakage to or from the outside environment.

Figure 5A:
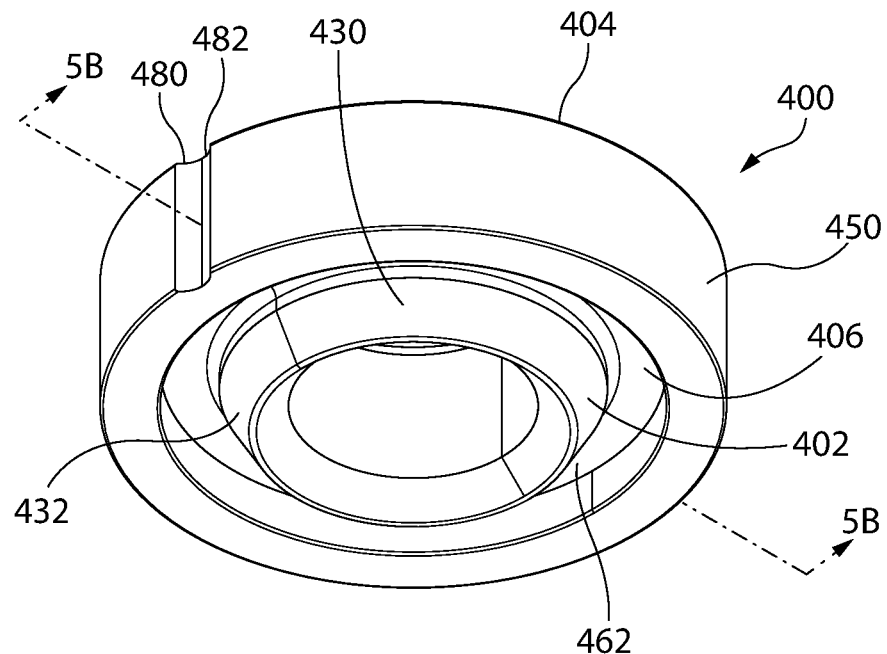
FIG. 5A is a perspective view of a first embodiment of a seal ring as may be used in the fluid delivery system of the present invention.
Figure 5B:
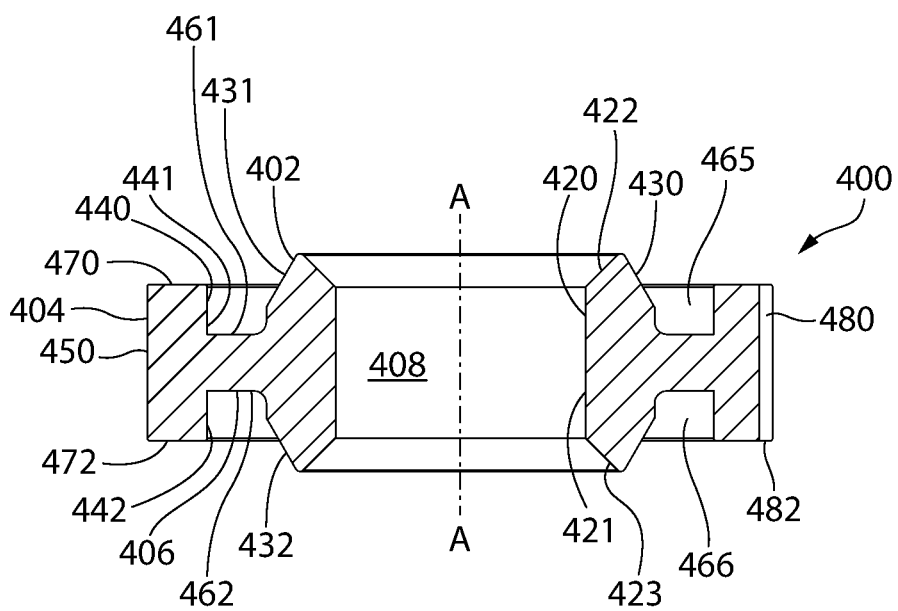
FIG. 5B is a cross-sectional view of the seal ring of FIG. 5A, taken along line 5B-5B.
Figure 6A:
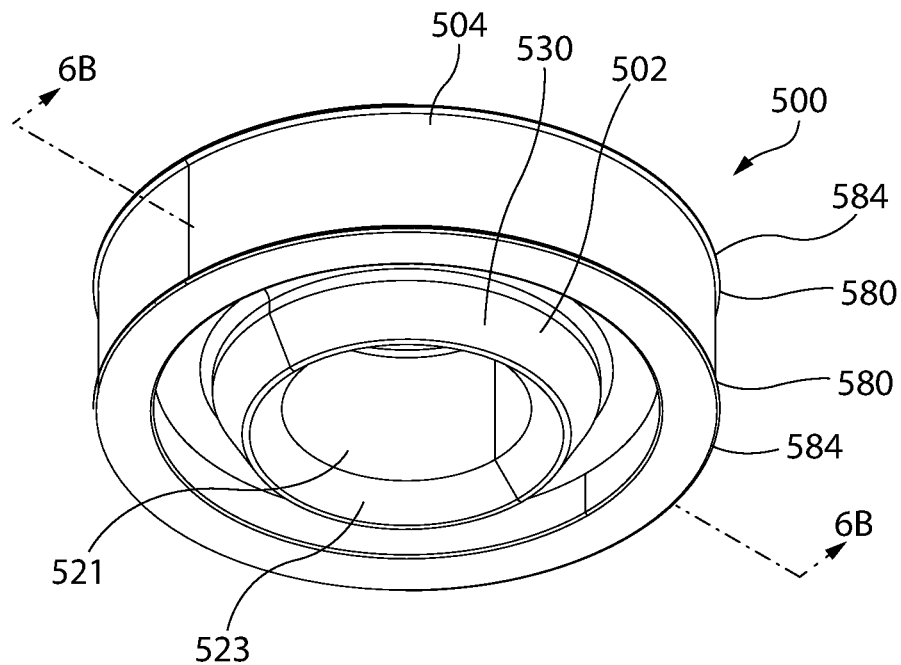
FIG. 6A is a perspective view of a second embodiment of a seal ring as may be used in the fluid delivery system of the present invention.
Figure 6B:
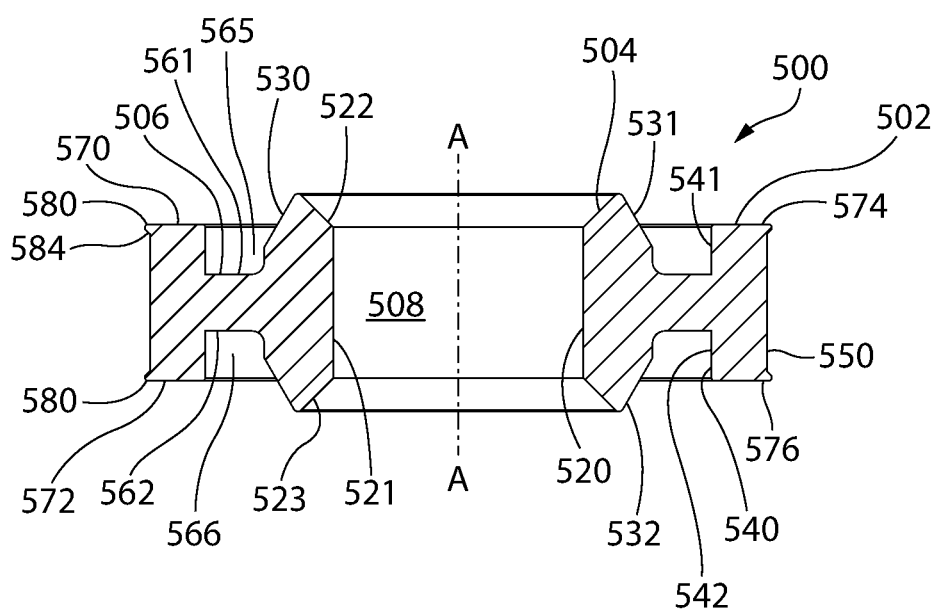
FIG. 6B is a cross-sectional view of the seal ring of FIG. 6A, taken along line 6B-6B.

Turning to FIGS. 5A and 5B, a seal ring 400 is illustrated. The seal ring 400 is similar to the seal ring 300 but incorporates additional features as discussed herein. All reference numerals are identical to those described above except as noted. The seal ring 400 has an interior sleeve 402 and an outer ring 404. A sleeve fluid passageway 408 extends through the interior sleeve 402. The seal ring 400 is formed in a generally annular configuration, with the interior sleeve 402 and the outer ring 404 symmetrical about a longitudinal axis A-A. The interior sleeve 402 has a passageway surface 420 which forms the wall of the sleeve fluid passageway 408. The passageway surface 420 comprises an upper inclined surface 422, a lower inclined surface 423, and an intermediate surface 421. The intermediate surface 421 couples the upper and lower inclined surfaces 422, 423. The upper and lower inclined surfaces 422, 423 may have a linear profile (i.e. a straight line with constant slope) or may have a curved profile. The curved profile may be convex, concave, or any other desired shape. Similarly, the intermediate surface 421 may be linear and parallel to the longitudinal axis, linear and sloped with respect to the longitudinal axis, or curved in a convex or concave profile.

The interior sleeve 402 also comprises a first mating surface 430. The first mating surface 430 comprises an upper mating surface 431 and a lower mating surface 432. The upper and lower mating surfaces 431, 432 may have a linear geometry, a convex geometry, or a concave geometry. In the present embodiment, the upper and lower mating surfaces 431, 432 have a linear geometry.

The outer ring 404 has an inner surface 440 and an outer surface 450. The inner surface 440 is proximate the interior sleeve 402 and faces the first mating surface 430. The outer surface 450 is opposite the inner surface 440. The inner surface 440 may be divided into an upper inner surface 441 and a lower inner surface 442.

The interior sleeve 402 is joined to the outer ring 404 by a web 406, the web 406 separating the upper and lower inner surfaces 441, 442 and the upper and lower mating surfaces 431, 432. The web 406 has an upper web surface 461 and a lower web surface 462. The upper web surface 461, along with the upper inner surface 441 of the inner surface 440 outer ring 404 and the upper mating surface 431 of the first mating surface 430, form an annular upper sleeve groove 465. Similarly, the lower web surface 462, along with the lower inner surface 442 of the inner surface 440 of the outer ring 404 and the lower mating surface 432 of the first mating surface 430, form an annular lower sleeve groove 466. The outer ring 404 further comprises an upper terminal surface 470 and a lower terminal surface 472. The upper and lower terminal surfaces 470, 472 join the inner surface 440 to the outer surface 450.

Formed in the outer surface 450 of the seal ring 400 is a seal retention feature 480. The seal retention feature 480 takes the form of a groove 482 extending from the upper terminal surface 470 to the lower terminal surface 472. The groove 482 of the seal retention feature 480 extends parallel to the longitudinal axis A-A. In other embodiments, the groove 482 may extend at an angle to the longitudinal axis A-A such that it is helical, slopes toward or away from the longitudinal axis A-A, or has any other shape. The groove 482 need not have a constant cross-sectional profile, and may have any desired shape. In the present example, the groove 480 has a concave curvature such that it is a portion of a circle.

When in an assembled state, the inner and outer surfaces 440, 450 are in contact with the corresponding surfaces of the seal cavities 110, 210 with the exception of groove 480. The channel inner surfaces 131, 231 engage the inner surface 440 of the seal ring 400 while the channel outer surfaces 133, 233 engage the outer surface 450 of the seal ring 400. In particular, the channel inner surface 131 engages the lower inner surface 442 of the seal ring 400. The channel inner surface 231 engages the upper inner surface 441 of the seal ring 400. Thus, the outer ring 404 is radially compressed by the substrate seal channel 130 and the component seal channel 230. The upper and lower terminal surfaces 470, 472 are spaced from the channel floors 132, 232. Similarly, the upper web surface 461 is spaced from the component ring 226 and the lower web surface 462 is spaced from the substrate 126. This beneficially ensures that the first and second mating surfaces 430, 120, 220 are in contact without being over-constrained. As a result, the interface between the first and second mating surfaces 430, 120, 220 form a first seal. The interface between the channel inner surfaces 131, 231 and the inner surface 440 of the seal ring 300 form a second seal. The interface between the channel outer surfaces 133, 233 and the outer surface 450 does not form a third seal due to the existence of the groove 482 of the seal retention feature 480.

Turning to FIGS. 5C-5F, method of installing a seal ring 400 is illustrated. In FIG. 5C, the seal ring 400 is shown positioned above a seal cavity 110 of a substrate block 104. Liquid 399 is located within a substrate seal channel 130. FIG. 5D illustrates the seal ring 400 being inserted into the seal cavity 110. As the seal ring 400 is inserted into the seal cavity 110, the liquid 399 is displaced by the outer ring 404. The liquid escapes via the groove 482, reducing the force required to insert and retain the seal ring 400 into the seal cavity 110. In FIG. 5E, it is illustrated that substantially all of the liquid 399 is displaced. Finally, in FIG. 5F, a fluid flow component 200 is mounted to the substrate block 104. The seal retention feature 480 ensures that the seal ring 400 stays in position in the seal cavity 110 by allowing liquid 399 to escape and avoiding pressurizing the liquid 399.

FIG. 6A-6F illustrate yet another embodiment of a seal ring 500. The seal ring 500 is similar to the seal ring 300 except as discussed herein. All reference numerals are identical to those described above except as noted. The seal ring 500 has an interior sleeve 502 and an outer ring 504. A sleeve fluid passageway 508 extends through the interior sleeve 502. The seal ring 500 is formed in a generally annular configuration, with the interior sleeve 502 and the outer ring 504 symmetrical about a longitudinal axis A-A. The interior sleeve 502 has a passageway surface 520 which forms the wall of the sleeve fluid passageway 508. The passageway surface 520 comprises an upper inclined surface 522, a lower inclined surface 523, and an intermediate surface 521. The intermediate surface 521 couples the upper and lower inclined surfaces 522, 523. The upper and lower inclined surfaces 522, 523 may have a linear profile (i.e. a straight line with constant slope) or may have a curved profile. The curved profile may be convex, concave, or any other desired shape. Similarly, the intermediate surface 521 may be linear and parallel to the longitudinal axis, linear and sloped with respect to the longitudinal axis, or curved in a convex or concave profile.

The interior sleeve 502 also comprises a first mating surface 530. The first mating surface 530 comprises an upper mating surface 531 and a lower mating surface 532. The upper and lower mating surfaces 531, 532 may have a linear geometry, a convex geometry, or a concave geometry. In the present embodiment, the upper and lower mating surfaces 531, 532 have a linear geometry.

The outer ring 504 has an inner surface 540 and an outer surface 550. The inner surface 540 is proximate the interior sleeve 502 and faces the first mating surface 530. The outer surface 550 is opposite the inner surface 540. The inner surface 540 may be divided into an upper inner surface 541 and a lower inner surface 542.

The interior sleeve 502 is joined to the outer ring 504 by a web 506, the web 506 separating the upper and lower inner surfaces 541, 542 and the upper and lower mating surfaces 531, 532. The web 506 has an upper web surface 561 and a lower web surface 562. The upper web surface 561, along with the upper inner surface 541 of the inner surface 540 outer ring 504 and the upper mating surface 531 of the first mating surface 530, form an annular upper sleeve groove 565. Similarly, the lower web surface 562, along with the lower inner surface 542 of the inner surface 540 of the outer ring 504 and the lower mating surface 532 of the first mating surface 530, form an annular lower sleeve groove 566. The outer ring 504 further comprises an upper terminal surface 570 and a lower terminal surface 572. The upper and lower terminal surfaces 570, 572 join the inner surface 540 to the outer surface 550.

Formed in the outer surface 550 of the seal ring 500 are a pair of seal retention features 580. The seal retention features 580 takes the form of a pair of lips 584 extending from the upper terminal surface 570 and the lower terminal surface 572. The lips 584 of the seal retention feature 580 extend substantially perpendicular to the longitudinal axis A-A and encircle the annular ring 500. Each of the lips 584 extend an entirety of the circumference of the outer surface 550. The lips 584 protrude beyond the outer surface 550 and are located at an upper edge 574 and a lower edge 576 of the outer ring 502. Each of the lips 584 have an outer diameter which is greater than an outer diameter of the outer surface 550. In other embodiments, the lips 584 may extend at an angle other than perpendicular to the longitudinal axis A-A or may not extend an entirety of the circumference of the seal ring 500.

When in an assembled state, the inner surface 540 is in contact with the corresponding surfaces of the seal cavities 110, 210. The channel inner surfaces 131, 231 engage the inner surface 540 of the seal ring 500. In particular, the channel inner surface 131 engages the lower inner surface 542 of the seal ring 500. The channel inner surface 231 engages the upper inner surface 541 of the seal ring 500. Thus, the outer ring 504 is radially compressed against the inner surfaces 131, 231 of the substrate seal channel 130 and the component seal channel 230. The upper and lower terminal surfaces 570, 572 are spaced from the channel floors 132, 232. Similarly, the upper web surface 561 is spaced from the component ring 226 and the lower web surface 562 is spaced from the substrate 126. This beneficially ensures that the first and second mating surfaces 530, 120, 220 are in contact without being over-constrained. As a result, the interface between the first and second mating surfaces 530, 120, 220 form a first seal. The interface between the channel inner surfaces 131, 231 and the inner surface 540 of the seal ring 300 form a second seal. The interface between the channel outer surfaces 133, 233 and the outer surface 450 does not form a third seal due to the existence of the lips 584 of the seal retention feature 580. However, the lips 584 engage the channel outer surfaces 133, 233 and are compressed by the channel outer surfaces 133, 233. This results in a third seal being formed at the interface between the channel outer surfaces 133, 233 and the lips 584.

Turning to FIGS. 6C-F, a method of installing a seal ring 500 is illustrated. In FIG. 6C, a seal ring 500 is positioned above a seal cavity 110 of a substrate block 104. In FIG. 6D, the seal ring 500 is partially inserted into the seal cavity 110. The outer ring 504 is received in the substrate seal channel 130. As can be seen, the lip 584 is in contact with the channel outer surface 133 while the outer surface 550 is spaced from the channel outer surface 133.

In FIG. 6E, a fluid flow component 200 is mounted to the substrate block 104 and the seal ring 500 is compressed therebetween. The lip 584 of the seal retention feature 580 remains in contact with the channel outer surface 133 of the seal channel 130, while the outer surface 550 is spaced from the channel outer surface 133. Finally, FIG. 6F illustrates removal of the fluid flow component 200 and the seal ring 500. As can be seen, a groove 184 is formed by extended contact between the channel outer surface 133 and the lip 584. The lip 584 deforms the channel outer surface 133 when the seal ring 500 is installed for a prolonged period of time. Formation of the groove 184 may occur after a day, a week, a month, or longer.

The lip 584 serves to increase the retention force of the seal ring 500 when installed in the seal cavity 110. This beneficially aids in assembly of the fluid flow component 200 by reducing the chance that the seal ring 500 moves while the fluid flow component 200 is positioned over the substrate block 104. In addition, the formation of a groove 184 facilitates maintenance and reassembly by improving retention of a replacement seal ring 500.

Figure 7A:
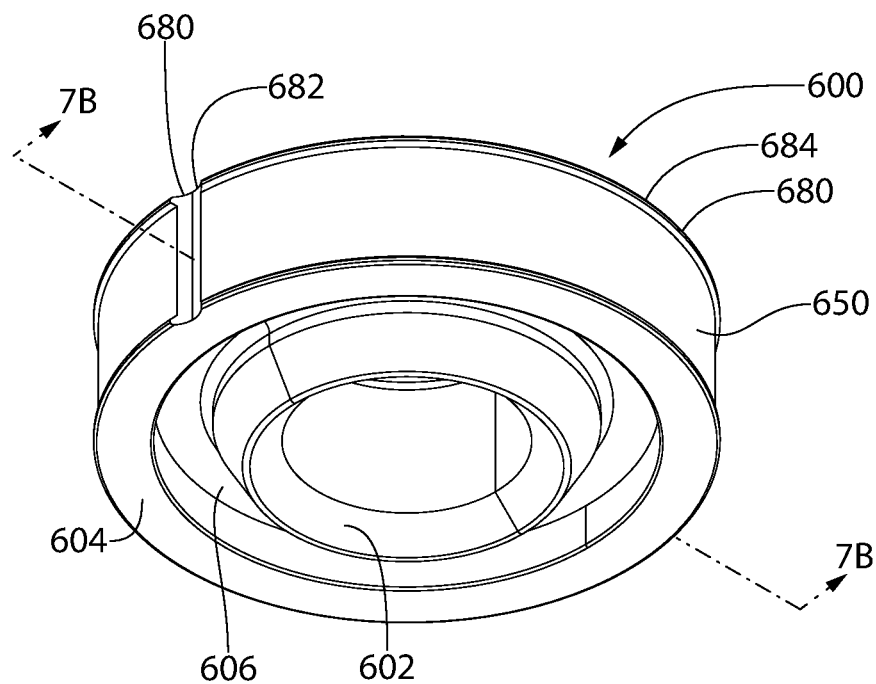
FIG. 7A is a perspective view of a third embodiment of a seal ring as may be used in the fluid delivery system of the present invention.
Figure 7B:
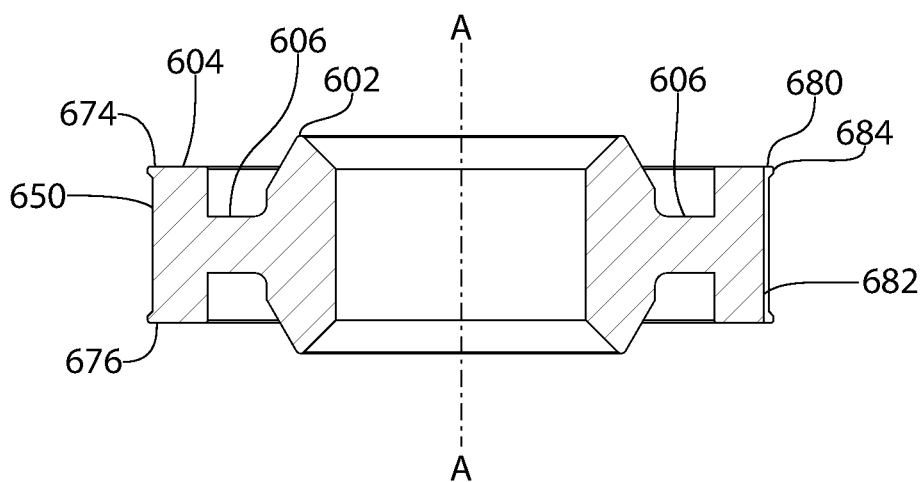
FIG. 7B is a cross-sectional view of the seal ring of FIG. 7A, taken along line 7B-7B.

Turning to FIGS. 7A and 7B, another embodiment of a seal ring 600 is illustrated. The seal ring 600 is substantially identical to the seal ring 500 with the exception of an additional groove 682. Thus, the seal ring 600 has an interior sleeve 602, an outer ring 604, a web 606 extending from the interior sleeve 602 to the outer ring 604. The outer ring 604 has an inner surface 640 and an outer surface 650. The outer surface 650 has seal retention features 680 formed thereon. In particular, the seal retention features 680 include a groove 682 arranged parallel to the longitudinal axis A-A similar to the seal ring 400.

In addition, a pair of lips 684 are formed at upper and lower edges 674, 676. The lips 684 extend around the circumference of the seal ring 600 and have an outer diameter which is greater than an outer diameter of the outer surface 650 of the outer ring 604. The lips 684 are interrupted by the groove 682, but are otherwise continuous. The groove 682 has a concave surface and extends through both the lips 684 and the outer surface 650. The groove 682 may have any shape including a slot with flat walls and bottom or any other profile. The cross-section of the groove 682 need not be continuous, and may vary from the upper edge 674 to the lower edge 676 as shown.

Figure 7C:
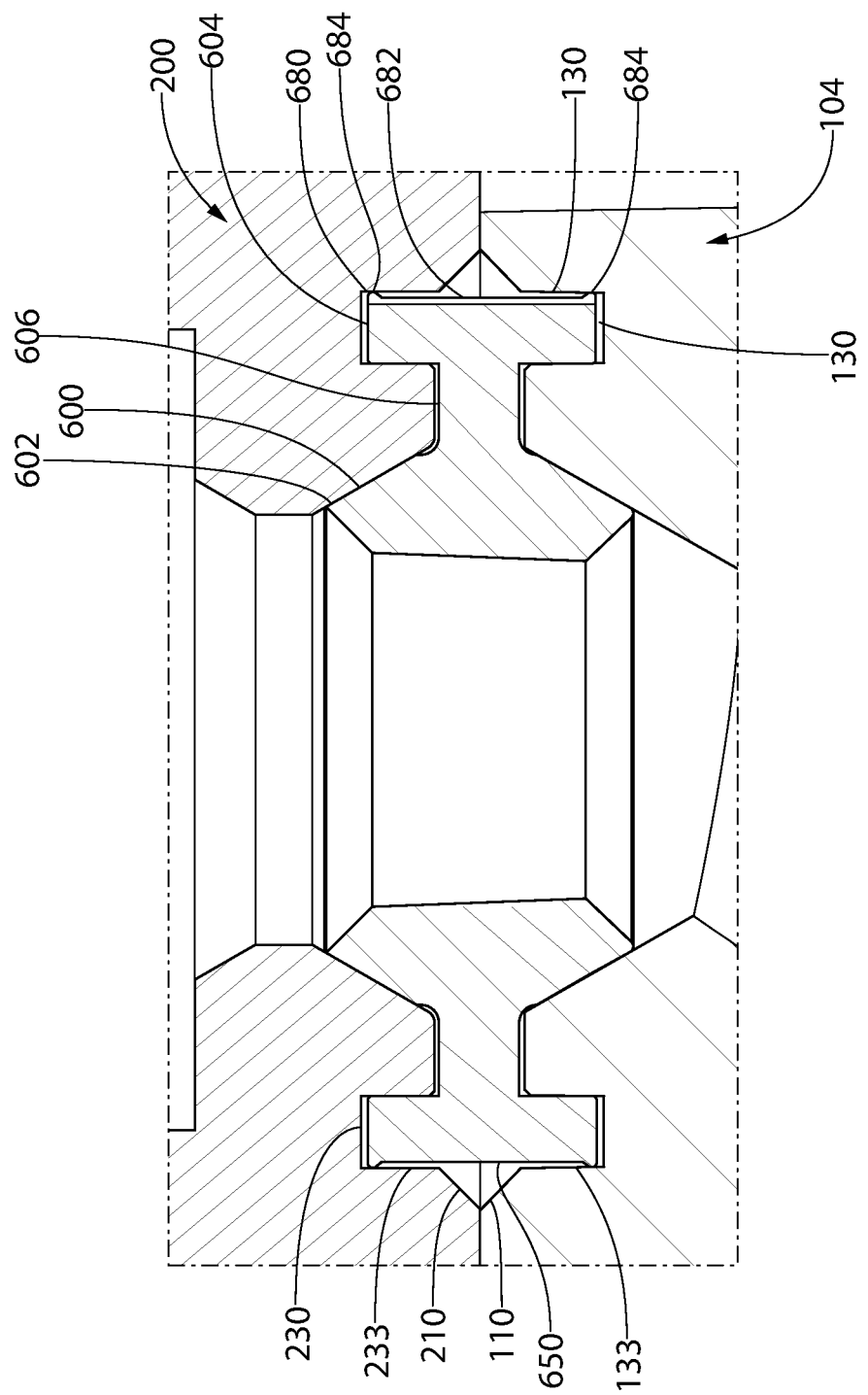
FIG. 7C is a detail view of the seal ring of FIG. 7A assembled between portions of a substrate block and an active component.

FIG. 7C illustrates the seal ring 600 installed in between a fluid flow component 200 and a substrate block 104. The seal ring 600 is inserted into the seal cavities 210, 110 of the fluid flow component 200 and substrate block 104. As can be seen, the outer ring 604 is inserted into the substrate seal channel 130 and the component seal channel 230. The outer surface 650 of the seal ring 600 is spaced from the channel inner surfaces 133, 233. The lips 684 engage the channel inner surfaces 133, 233 and the groove 682 allows fluid trapped in the seal cavities 110, 210 to escape prior to installation of the fluid flow component 200 on the substrate block 104.

Figure 8A:
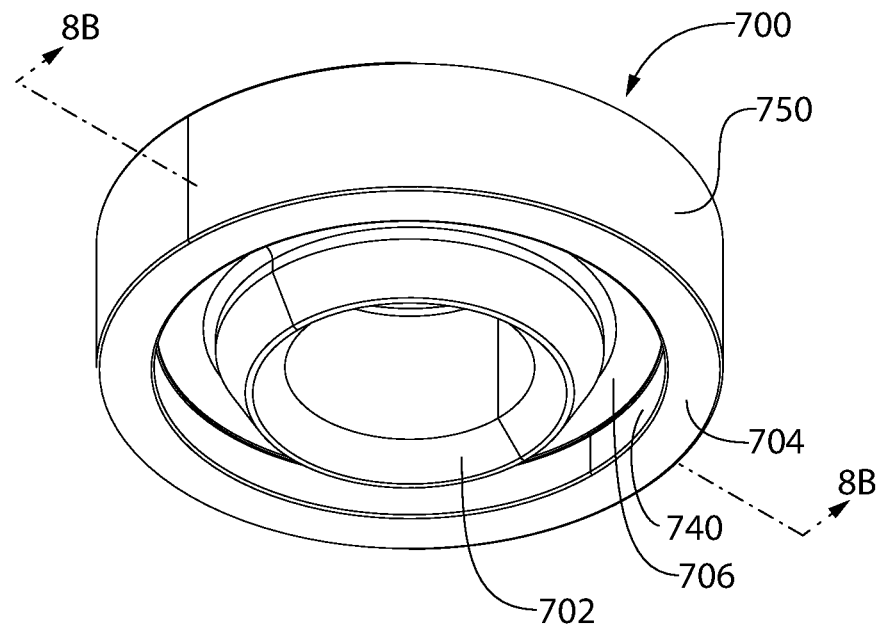
FIG. 8A is a perspective view of a fourth embodiment of a seal ring as may be used in the fluid delivery system of the present invention.
Figure 8B:
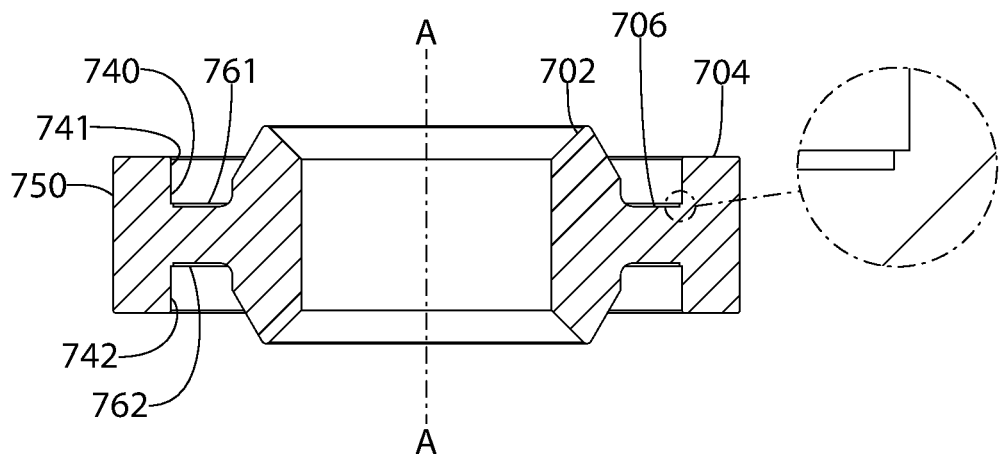
FIG. 8B is a cross-sectional view of the seal ring of FIG. 8A, taken along line 8B-8B.
Figure 8C:
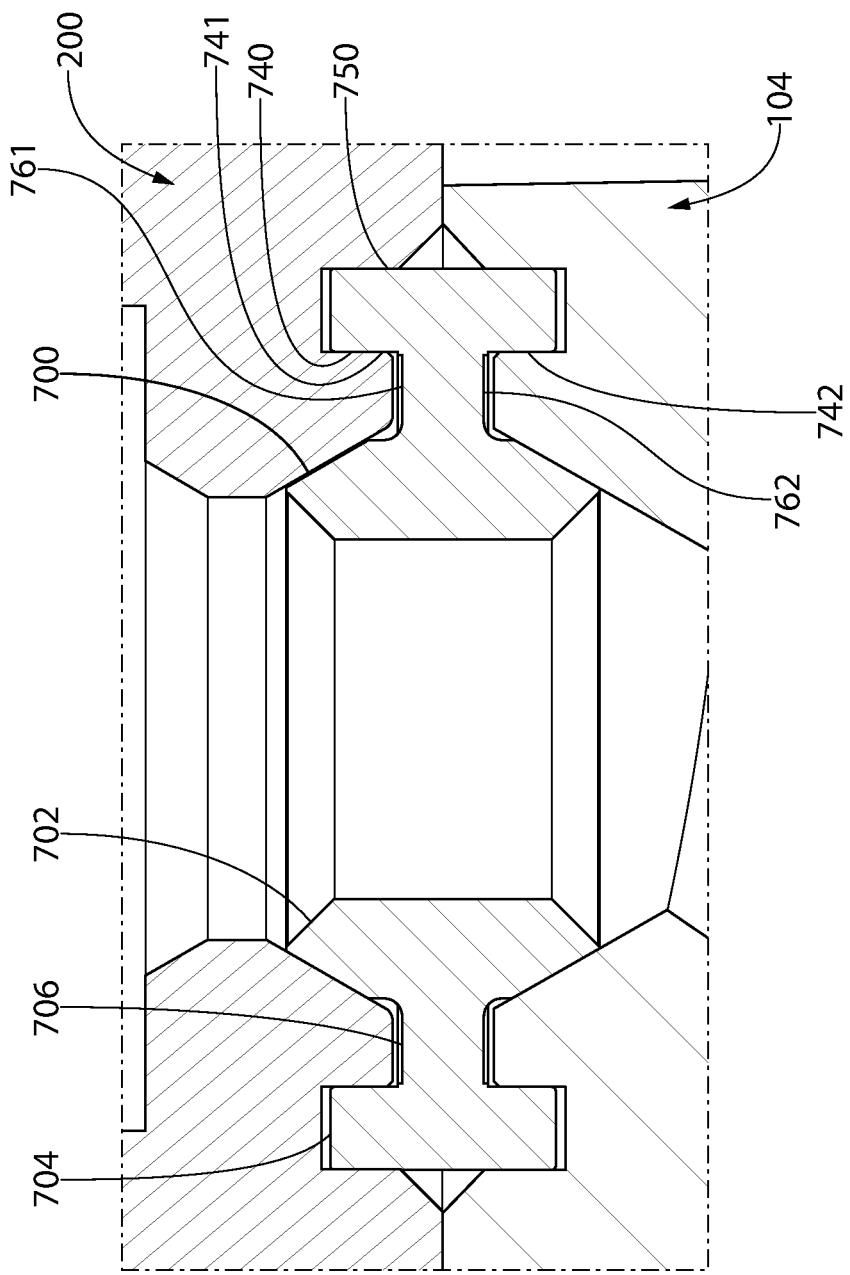
FIG. 8C is a detail view of the seal ring of FIG. 8A assembled between portions of a substrate block and an active component.

Turning to FIGS. 8A-8C, another embodiment of a seal ring 700 is illustrated. The seal ring 700 is substantially identical to the seal ring 300 except as noted below. Thus, the seal ring 700 has an interior sleeve 702, an outer ring 704, a web 706 extending from the interior sleeve 702 to the outer ring 704. The outer ring 704 has an inner surface 740 and an outer surface 750. The inner surface 740 is divided into an upper inner surface 741 and a lower inner surface 742. The outer ring 704 is modified such that the thickness of the outer ring 704 as measured from the inner surface 740 to the outer surface 750 may be reduced. Similarly, the web 706 may be modified to have a reduced thickness along a longitudinal axis A-A from an upper web surface 761 to a lower web surface 762.

This reduction in thickness eases assembly and only marginally decreases the effectiveness of the second and third seals formed by the interfaces between the channel inner surfaces 131, 231 and the inner surface 740 and the channel outer surfaces 133, 233 and the outer surface 750. The reduced thickness of the web 706 may also offer increased space for liquid in the event that some liquid remains. Finally, decreasing the thicknesses of the web 706 and the outer ring 704 may permit liquid to escape and avoid issues with seal ring retention during assembly while still enabling the second and third seals to be formed.

Figure 9A:
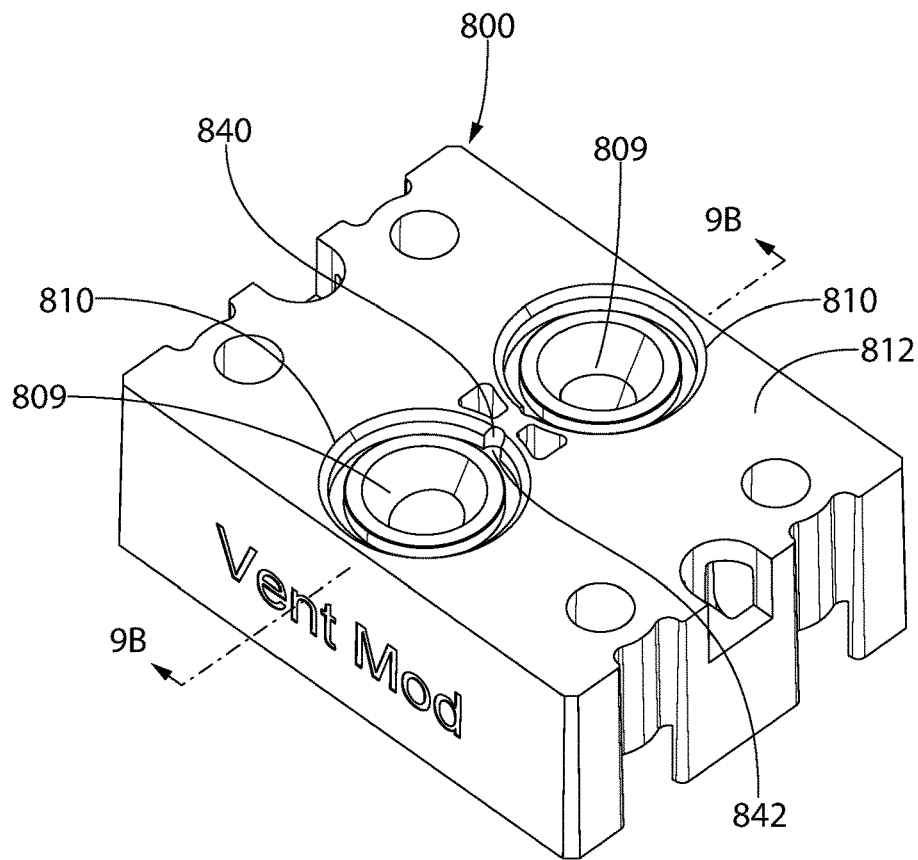
FIG. 9A is a perspective view of a first embodiment of a substrate block as may be used in the fluid delivery system of the present invention.
Figure 9B:
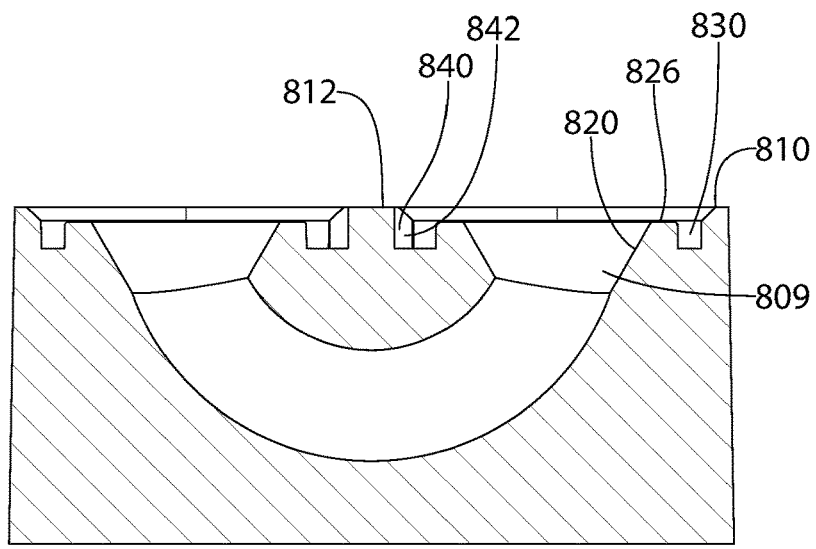
FIG. 9B is a cross-sectional view of the substrate block of FIG. 9A, taken along line 9B-9B.
Figure 9C:
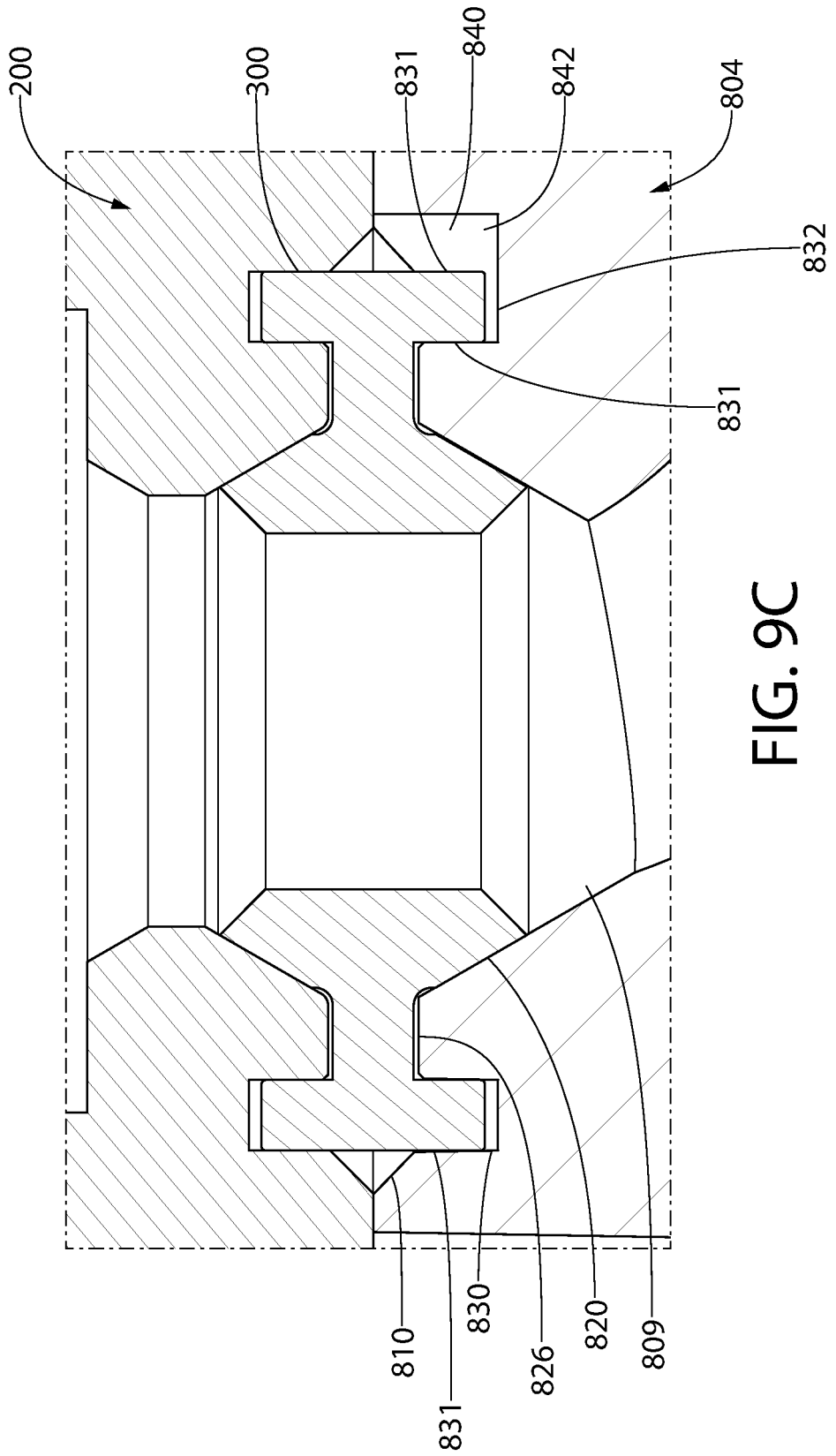
FIG. 9C is a detail view of the substrate block of FIG. 9A assembled with a seal ring and an active component.

Turning to FIGS. 9A-9C, an exemplary substrate block 804 is illustrated. The substrate block 804 is substantially identical to the substrate block 104 as described above with the exceptions as noted herein. The substrate block 804 utilizes a seal cavities 810 which surround the ports 809. The seal cavities 810 have a second mating surface 820, a substrate ring 826, and a substrate seal channel 830. The second mating surface 820 forms a portion of the substrate port 809 just as with substrate block 104.

The substrate ring 826 defines the substrate port 809. The substrate port 809 terminates at the substrate ring 826 and is surrounded by the substrate ring 826. The substrate ring 826 is recessed with respect to an upper surface 812 of the substrate block 804. Surrounding the substrate ring 826 is the substrate seal channel 830. The substrate seal channel 830 is recessed with respect to the substrate ring 826 and the upper surface 812 of the substrate block 804. Thus, the substrate ring 826 protrudes above the substrate seal channel 830. The substrate ring 826 may have any desired geometry.

The substrate seal channel 830 has a channel inner surface 831, a channel floor 832, and a channel outer surface 833. The channel inner surface 831 is adjacent to the substrate ring 826. The channel outer surface 833 is opposite the channel inner surface 833 and is radially outward from the channel inner surface 831. The channel floor 832 joins the channel inner surface 831 and the channel outer surface 833.

The seal cavity 810 further comprises a seal retention feature 840. The seal retention feature 840 comprises a vent passageway 842 formed into the seal cavity 810 instead of the seal 300. The vent passageway 842 prevents the channel outer surface 833 from sealing against the outer surface 350 but does permit fluid to pass through the vent passageway 842 unimpeded. This beneficially aids in seal retention. The vent passageway 842 may have a concave surface as shown or may be any other profile as desired. The vent passageway 842 extends from the upper surface 812 to the channel floor 832. However, in other embodiments the vent passageway 842 may not extend to the channel floor 832, but may be spaced therefrom.

As can be seen in FIG. 9C, a fluid flow component 200, a substrate block 804, and a seal 300 are illustrated with the seal 300 compressed between the substrate block 804 and the fluid flow component 200. In alternate configurations, the fluid flow component 200 may also incorporate a seal retention features 840 such as a vent passageway 842. In yet other configurations, both the fluid flow component 200 and the substrate block 804 may incorporate the vent passageway 842.

Figure 10A:
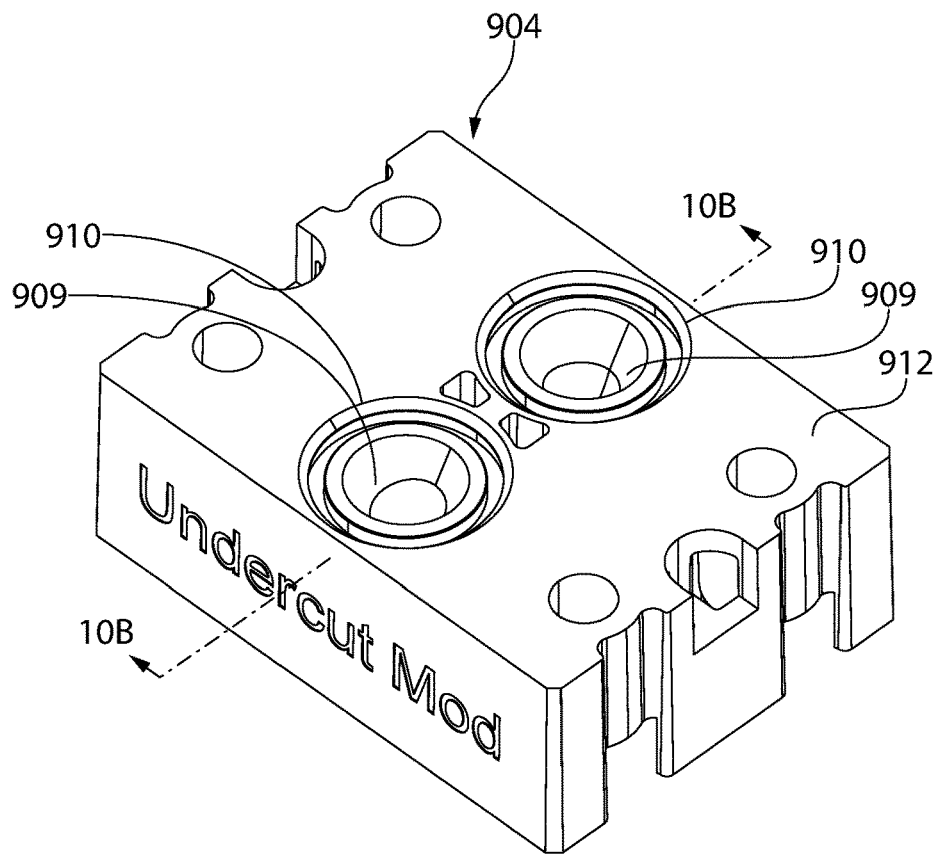
FIG. 10A is a perspective view of a second embodiment of a substrate block as may be used in the fluid delivery system of the present invention.
Figure 10B:
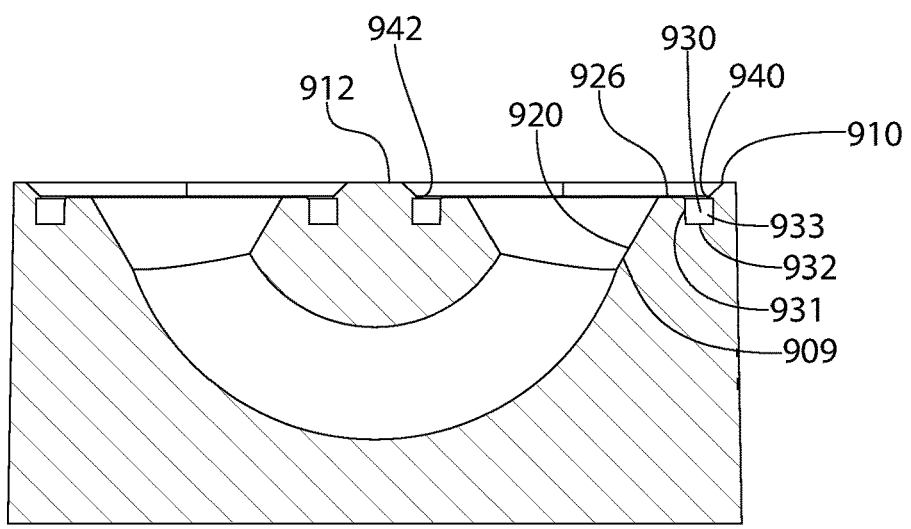
FIG. 10B is a cross-sectional view of the substrate block of FIG. 10A, taken along line 10B-10B.
Figure 10C:
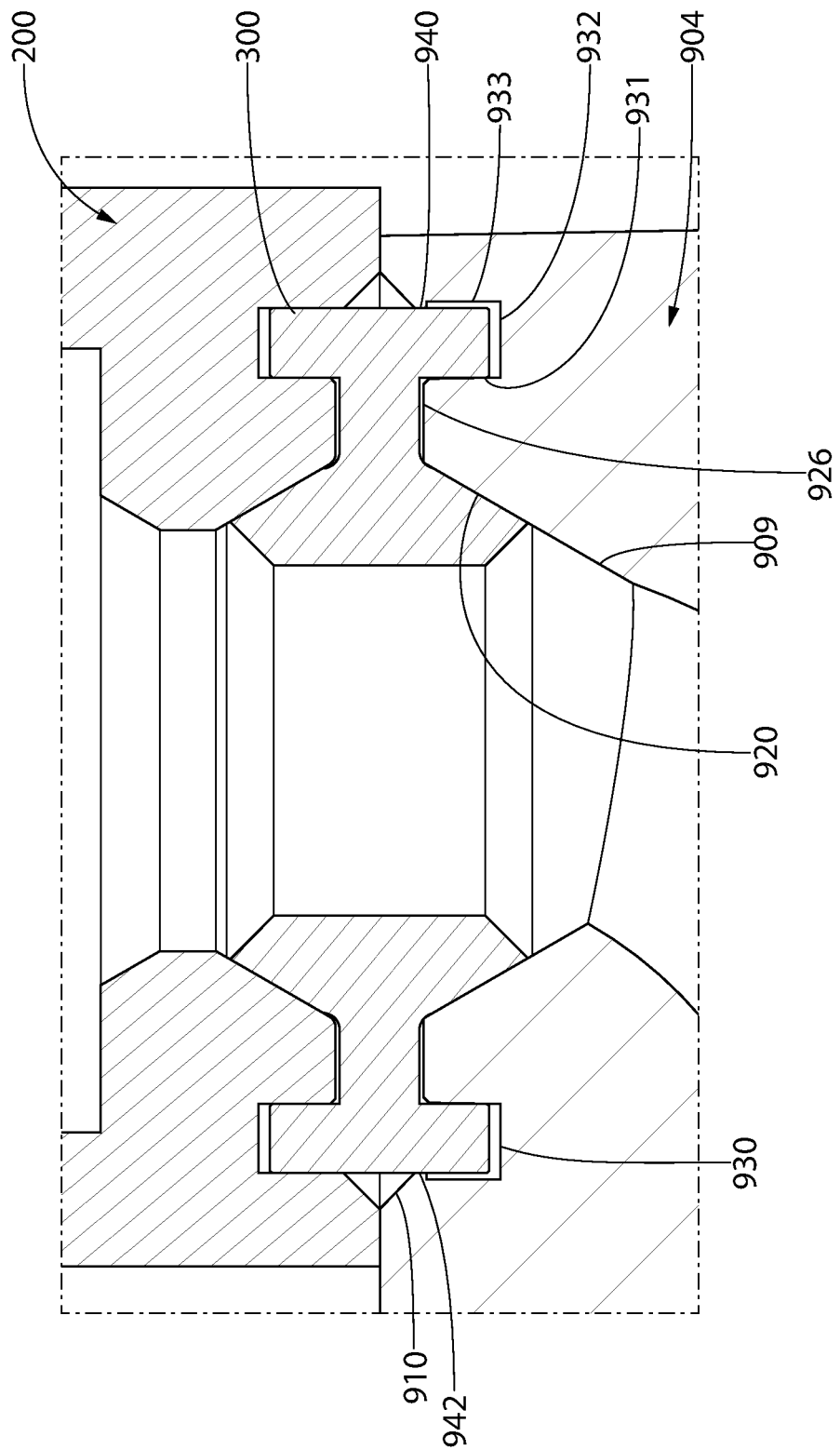
FIG. 10C is a detail view of the substrate block of FIG. 10A assembled with a seal ring and an active component.

FIGS. 10A-C illustrate yet another embodiment of a substrate block 904. The substrate block 904 is substantially identical to the substrate block 104 as described above with the exceptions as noted herein. The substrate block 904 utilizes a seal cavities 910 which surround the ports 909. The seal cavities 910 have a second mating surface 920, a substrate ring 926, and a substrate seal channel 930. The second mating surface 920 forms a portion of the substrate port 909 just as with substrate block 104.

The substrate ring 926 defines the substrate port 909. The substrate port 909 terminates at the substrate ring 926 and is surrounded by the substrate ring 926. The substrate ring 926 is recessed with respect to an upper surface 912 of the substrate block 904. Surrounding the substrate ring 926 is the substrate seal channel 930. The substrate seal channel 930 is recessed with respect to the substrate ring 926 and the upper surface 912 of the substrate block 904. Thus, the substrate ring 926 protrudes above the substrate seal channel 930. The substrate ring 926 may have any desired geometry.

The substrate seal channel 930 has a channel inner surface 931, a channel floor 932, and a channel outer surface 933. The channel inner surface 931 is adjacent to the substrate ring 926. The channel outer surface 933 is opposite the channel inner surface 933 and is radially outward from the channel inner surface 931. The channel floor 932 joins the channel inner surface 931 and the channel outer surface 933.

The seal cavity 910 further comprises a seal retention feature 940. The seal retention feature 940 comprises a lip 942 formed on the channel outer surface 933 of the seal cavity 910 instead of the seal 300. The lip 942 engages the outer surface 350 of a seal 300. In this embodiment of the substrate block 904, the channel outer surface 933 is spaced from the outer surface 350 of the seal 300. The lip 942 deforms the outer surface 350 of the seal 300 and retains the seal 300. As can be seen, the lip 942 has an inner diameter which is less than an outer diameter of the outer surface 350 of the seal 300. In some embodiments, the lip 942 does not extend around an entirety of the circumference of the channel outer surface 933. In other embodiments, the lip 942 may be combined with other seal retention features described above. Furthermore, the lip 942 may be incorporated in either or both of the substrate block 904 and the fluid flow component 200.

As can be seen in FIG. 10C, a fluid flow component 200, a substrate block 904, and a seal 300 are illustrated with the seal 300 compressed between the substrate block 904 and the fluid flow component 200. In alternate configurations, the fluid flow component 200 may also incorporate a seal retention features 940 such as a lip 942. As noted above, both the fluid flow component 200 and the substrate block 904 may incorporate the lip 942.

Figure 11A:
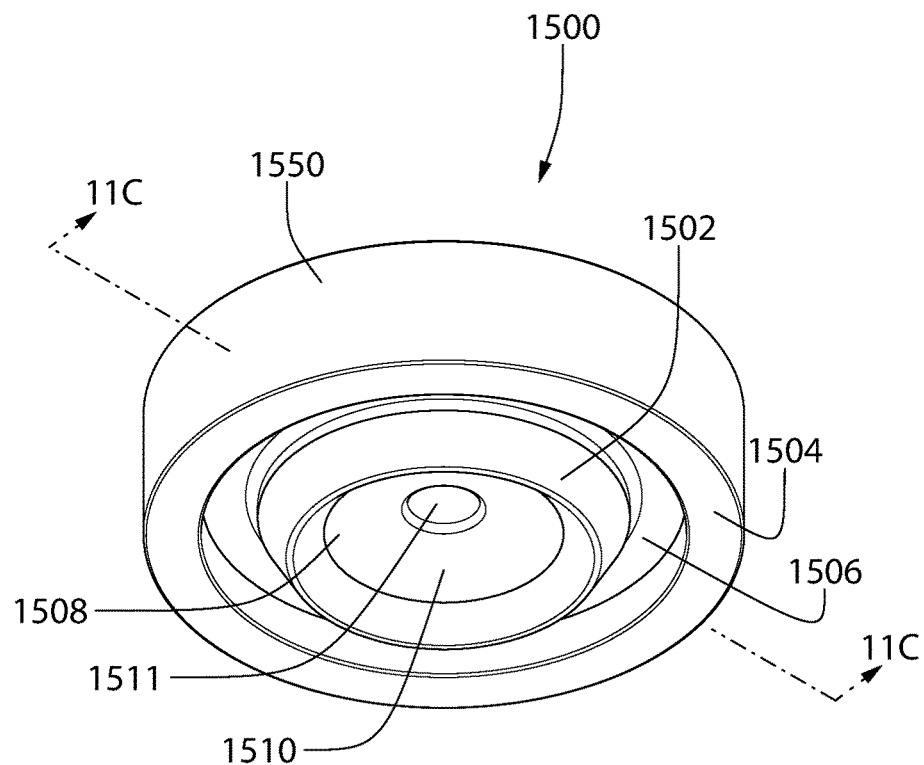
FIG. 11A is a perspective view of a fifth embodiment of a seal ring as may be used in the fluid delivery system of the present invention.
Figure 11B:
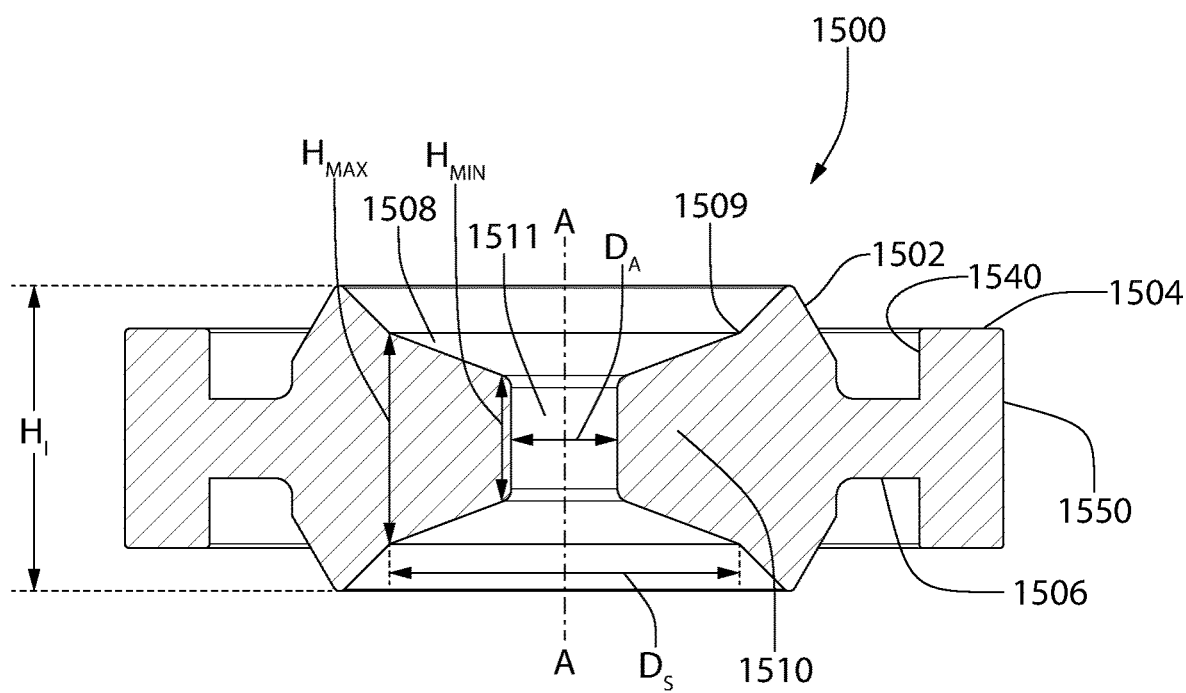
FIG. 11B is a cross-sectional view of the seal ring of FIG. 11A, taken along line 11B-11B.
Figure 11C:
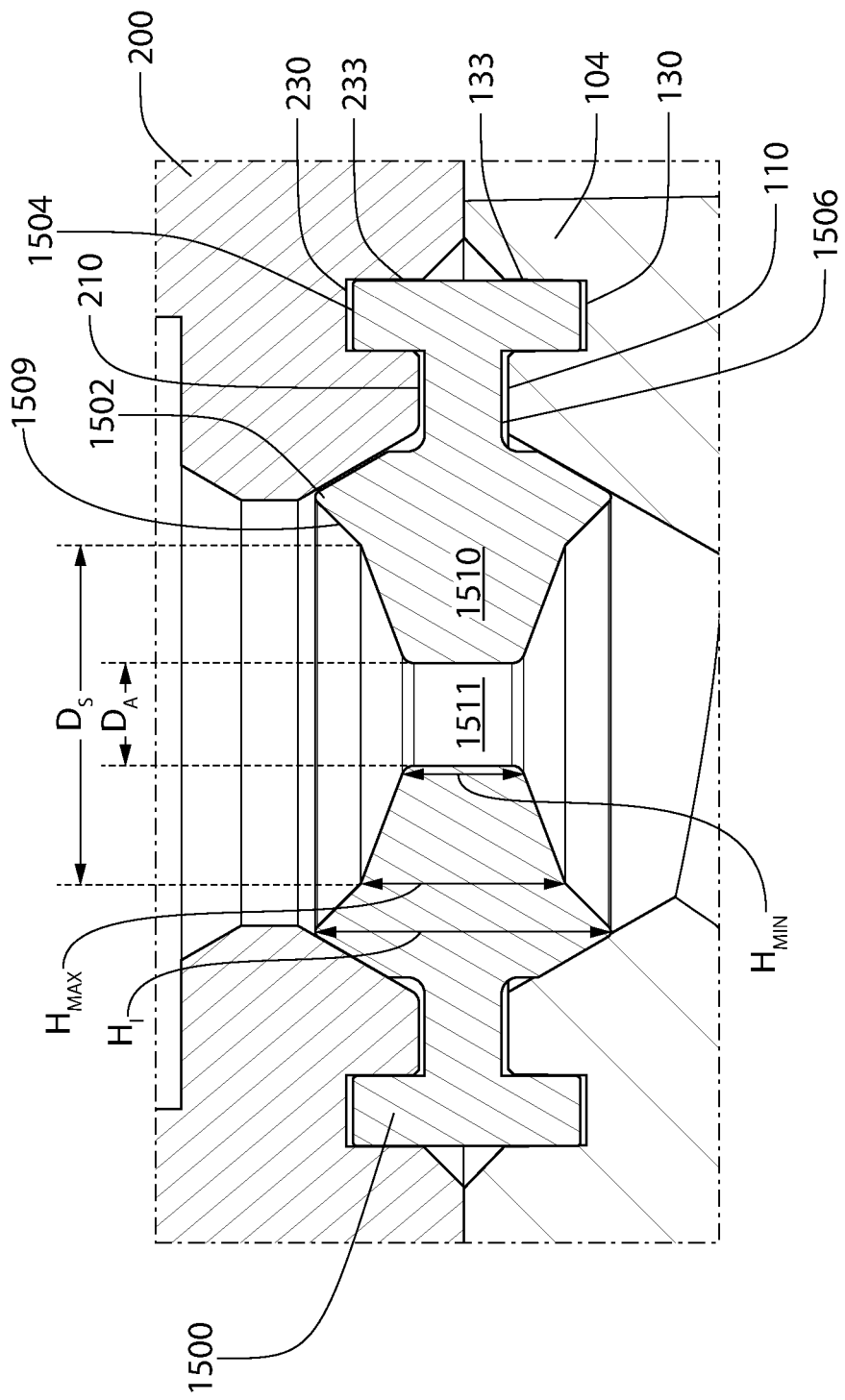
FIG. 11C is a detail view of the seal ring of FIG. 11A assembled between portions of a substrate block and an active component.

Turning to FIGS. 11A-C, another embodiment of a seal ring 1500 is illustrated. The seal ring 1500 is similar to the seal ring 500 except as discussed below. Thus, the seal ring 1500 has an interior sleeve 1502, an outer ring 1504, a first web 1506 extending from the interior sleeve 1502 to the outer ring 1504. The outer ring 1504 has an inner surface 1540 and an outer surface 1550. A sleeve fluid passageway 1508 is defined by an interior surface 1509 of the interior sleeve 1502. A second web 1510 extends across the sleeve fluid passageway 1508. The second web 1510 comprises an aperture 1511 that extends through the second web 1510 along a longitudinal axis A-A. The longitudinal axis A-A extends along the sleeve fluid passageway 1508 of the interior sleeve 1502. The seal ring 1500 is symmetrical about the longitudinal axis.

The aperture 1511 may be sized to provide a known pressure drop for a specific fluid and flow rate. Thus, the aperture 1511 may be used to restrict flow and the exact size of the aperture 1511 may be selected to achieve a given pressure drop or flow rate for a particular fluid. The second web 1510 may have a maximum height $H_{Max}$ and a minimum height $H_{Min}$, the maximum height $H_{Max}$ being greater than the minimum height $H_{Min}$. The maximum height $H_{Max}$ is located proximate the interior surface 1509 of the interior sleeve 1502 and the minimum height $H_{Min}$ is located proximate the aperture 1511. Thus, the second web 1510 tapers toward the longitudinal axis A-A. Optionally, the second web 1510 may have a constant thickness, such that the maximum height $H_{Max}$ and minimum height $H_{Min}$ are equal. The maximum height $H_{Max}$ is less than a height $H_I$ of the interior sleeve 1502.

The aperture 1511 also has a diameter $D_A$ which is less than a diameter $D_S$ of the sleeve fluid passageway 1508. Thus, the aperture 1511 provides a greater restriction to fluid flow than a seal ring which lacks the second web 1510. The diameter $D_A$ may be sized to achieve a desired pressure drop or flow rate of a fluid used in the fluid delivery system 1500. Optionally, a plurality of apertures 1511 may be provided through the second web 1510 and need not all be aligned with the longitudinal axis A-A. Instead, the plurality of apertures 1511 may be spaced in a circular pattern about the second web 1510 or may be arranged in any desired configuration.

FIG. 11C illustrates the seal ring 1500 installed in between a fluid flow component 200 and a substrate block 104. The seal ring 1500 is inserted into the seal cavities 210, 110 of the fluid flow component 200 and substrate block 104. As can be seen, the outer ring 1504 is inserted into the substrate seal channel 130 and the component seal channel 230. The outer surface 1550 of the seal ring 1500 is in contact with the channel inner surfaces 133, 233. The aperture 1511 constricts the flow path in the substrate block 104 and the fluid flow component 200, providing a restriction to fluid flow. This restriction may be selected to achieve a desired flow restriction and may also be selected to improve mixing of the fluid or for any other purpose. Optionally, the seal ring 1500 may also incorporate any of the seal retention features described above.

Figure 12A:
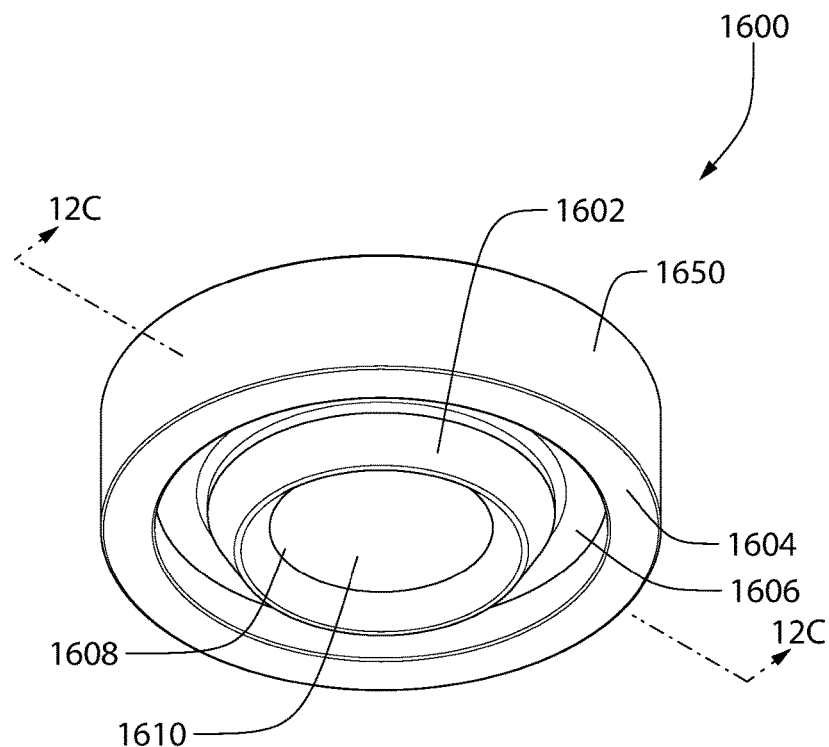
FIG. 12A is a perspective view of a sixth embodiment of a seal ring as may be used in the fluid delivery system of the present invention.
Figure 12B:
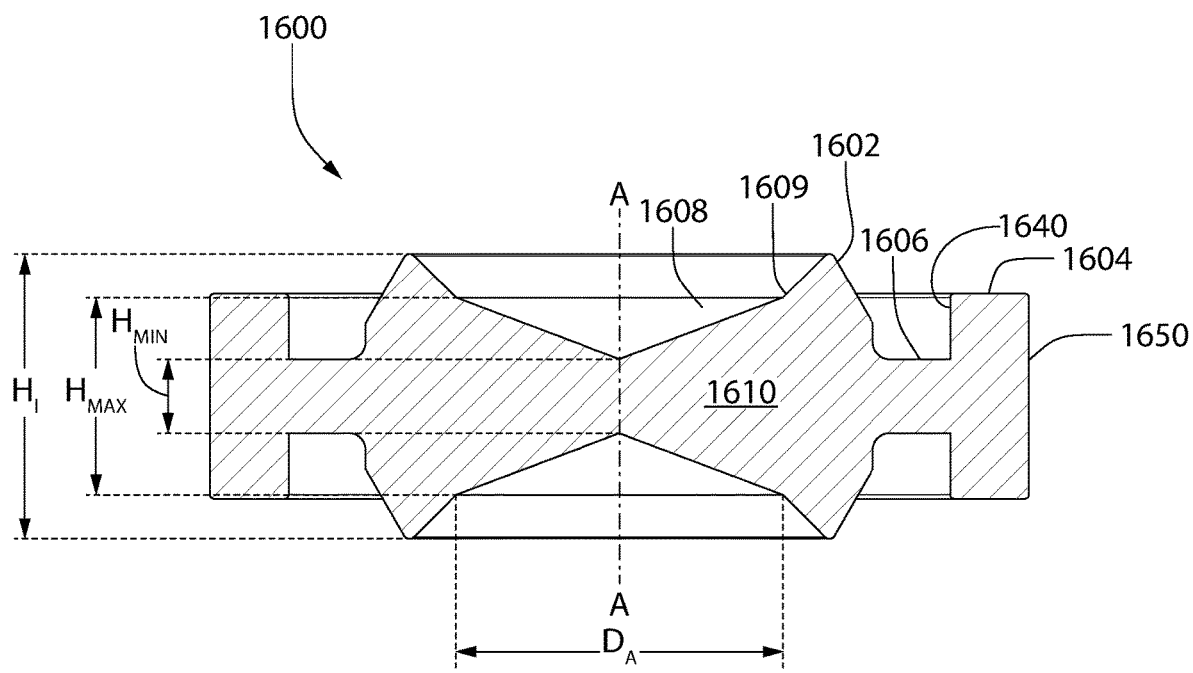
FIG. 12B is a cross-sectional view of the seal ring of FIG. 12A, taken along line 12B-12B.
Figure 12C:
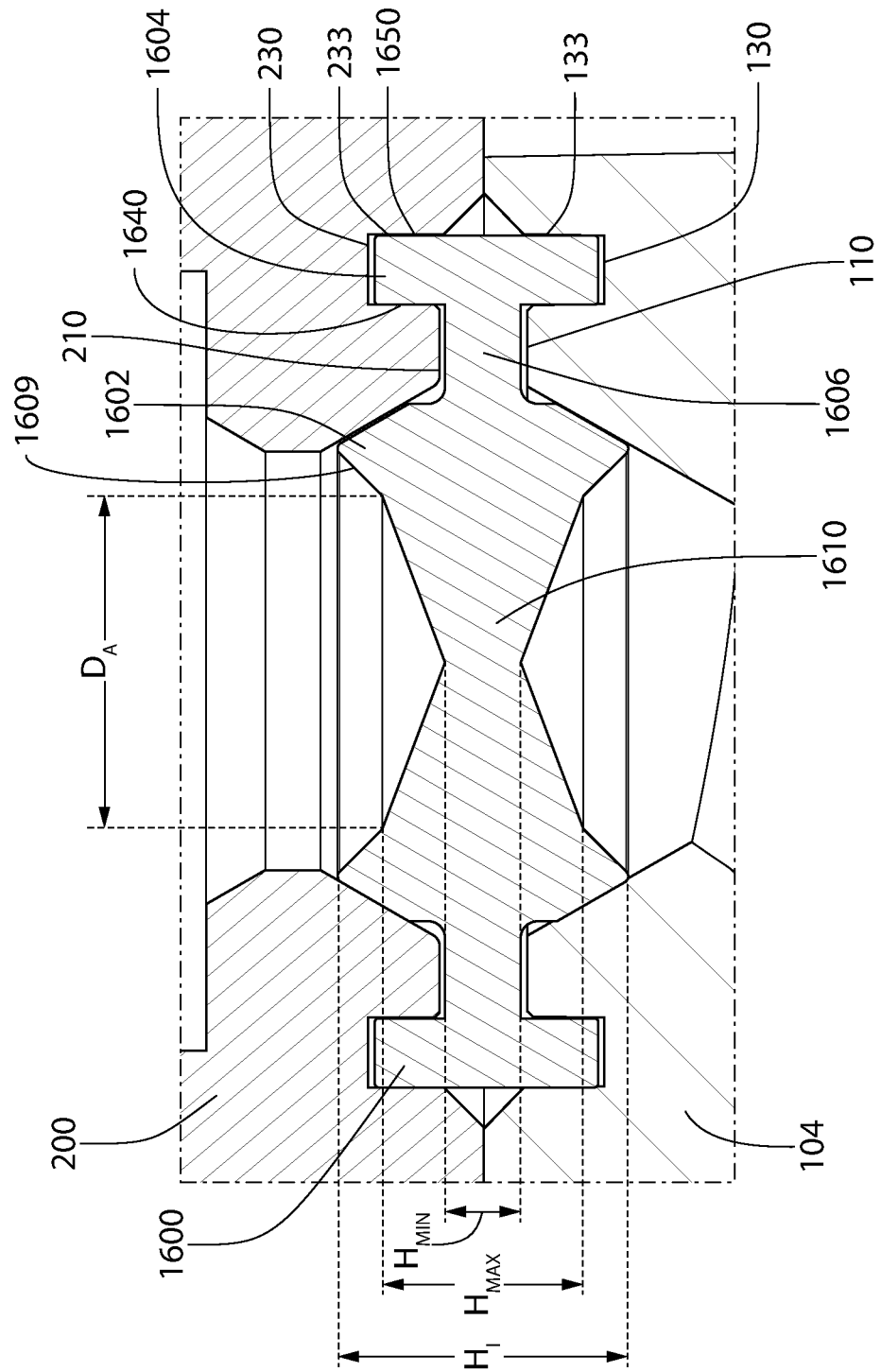
FIG. 12C is a detail view of the seal ring of FIG. 12A assembled between portions of a substrate block and an active component.

Turning to FIGS. 12A-C, another embodiment of a seal ring 1600 is illustrated. The seal ring 1600 is similar to the seal ring 500 except as discussed below. Thus, the seal ring 1600 has an interior sleeve 1602, an outer ring 1604, a first web 1606 extending from the interior sleeve 1602 to the outer ring 1604. The outer ring 1604 has an inner surface 1640 and an outer surface 1650. A sleeve fluid passageway 1608 is defined by an interior surface 1609 of the interior sleeve 1602. A second web 1610 extends across the sleeve fluid passageway 1608. A longitudinal axis A-A extends along the sleeve fluid passageway 1608 of the interior sleeve 1602. The seal ring 1600 is symmetrical about the longitudinal axis.

The second web 1610 may have a maximum height $H_{Max}$ and a minimum height $H_{Min}$, the maximum height $H_{Max}$ being greater than the minimum height $H_{Min}$. The maximum height $H_{Max}$ is located proximate the interior surface 1609 of the interior sleeve 1602 and the minimum height $H_{Min}$ is located proximate the longitudinal axis A-A. Thus, the second web 1610 tapers toward the longitudinal axis A-A. Optionally, the second web 1610 may have a constant thickness, such that the maximum height $H_{Max}$ and minimum height $H_{Min}$ are equal. The maximum height $H_{Max}$ is less than a height $H_I$ of the interior sleeve 1602. The sleeve fluid passageway 1608 has a diameter $D_S$. The second web 1610 extends across an entirety of the diameter $D_S$ to completely block the sleeve fluid passageway 1608. The second web 1610 prevents fluid flow through the sleeve fluid passageway 1608 and is free of holes or passages.

FIG. 12C illustrates the seal ring 1600 installed in between a fluid flow component 200 and a substrate block 104. The seal ring 1600 is inserted into the seal cavities 210, 110 of the fluid flow component 200 and substrate block 104. As can be seen, the outer ring 1604 is inserted into the substrate seal channel 130 and the component seal channel 230. The outer surface 1650 of the seal ring 1600 is in contact with the channel inner surfaces 133, 233. The second web 1610 blocks the flow path in the substrate block 104 and the fluid flow component 200, preventing fluid flow. This restriction may be selected to achieve a desired flow restriction and may also be selected to improve mixing of the fluid or for any other purpose. Optionally, the seal ring 1600 may also incorporate any of the seal retention features described above.

While the invention has been described with respect to specific examples including presently preferred modes of carrying out the invention, those skilled in the art will appreciate that there are numerous variations and permutations of the above-described systems and techniques. It is to be understood that other embodiments may be utilized, and structural and functional modifications may be made without departing from the scope of the present invention. Thus, the spirit and scope of the invention should be construed broadly as set forth in the appended claims.

The invention may be more fully described via the exemplary claims below.

Exemplary claim 1: A fluid delivery system comprising a substrate block comprising an upper surface; a first substrate port in the upper surface; a second substrate port in the upper surface; a substrate fluid passageway extending between the first substrate port and the second substrate port; a substrate ring defining the second substrate port; and a substrate seal channel formed in the upper surface and surrounding the substrate ring, an outer surface of the substrate ring forming an inner surface of the substrate seal channel. The fluid delivery system further comprising an active component comprising a lower surface; a first component port in the lower surface; a component fluid passageway extending from the first component port; a component ring defining the first component port; and a component seal channel formed in the lower surface and surrounding the component ring, an outer surface of the component ring forming an inner surface of the component seal channel. The fluid delivery system further comprising a seal ring comprising an interior sleeve defining a sleeve fluid passageway; and an outer ring connected to and surrounding the interior sleeve so that: (1) an annular upper sleeve groove is formed between an upper portion of the outer ring and an upper portion of the interior sleeve; and (2) an annular lower sleeve groove is formed between a lower portion of the outer ring and a lower portion of the interior sleeve, the outer ring comprising an inner surface, an outer surface, and a seal retention feature, the seal retention feature formed on the outer surface of the outer ring. The active component mounted to the substrate block so that: (1) the second substrate port and the first component port are aligned; and (2) the seal ring nests in each of the substrate seal channel and the component seal channel and the seal ring fluidly seals the substrate fluid passageway and the component fluid passageway.

Exemplary claim 2: The fluid delivery system of exemplary claim 1 wherein the seal ring comprises a longitudinal axis extending parallel to the interior sleeve, the seal ring being symmetrical about the longitudinal axis.

Exemplary claim 3: The fluid delivery system of exemplary claim 1 wherein the seal retention feature comprises a groove.

Exemplary claim 4: The fluid delivery system of exemplary claim 3 wherein the seal retention feature comprises a plurality of grooves.

Exemplary claim 5: The fluid delivery system of exemplary claim 3 wherein the seal ring comprises a longitudinal axis extending parallel to the interior sleeve, the groove extending parallel to the longitudinal axis.

Exemplary claim 6: The fluid delivery system of exemplary claim 1 wherein the seal retention feature comprises a lip.

Exemplary claim 7: The fluid delivery system of exemplary claim 6 wherein the lip is arranged at one of an upper edge of the outer ring or a lower edge of the outer ring.

Exemplary claim 8: The fluid delivery system of exemplary claim 6 wherein the seal retention feature comprises a plurality of lips.

Exemplary claim 9: The fluid delivery system of exemplary claim 6 wherein the lip has an outer diameter which is greater than an outer diameter of the outer surface of the outer ring.

Exemplary claim 10: The fluid delivery system of exemplary claim 9 wherein the outer diameter of the lip is greater than an outer diameter of an outer surface of the substrate seal channel.

Exemplary claim 11: A seal ring, the seal ring comprising an interior sleeve defining a sleeve fluid passageway; an outer ring connected to and surrounding the interior sleeve so that: (1) an annular upper sleeve groove is formed between an upper portion of the outer ring and an upper portion of the interior sleeve; and (2) an annular lower sleeve groove is formed between a lower portion of the outer ring and a lower portion of the interior sleeve, the outer ring comprising an inner surface, an outer surface, and a seal retention feature, the seal retention feature formed on the outer surface of the outer ring.

Exemplary claim 12: The seal ring of exemplary claim 11 wherein the seal ring comprises a longitudinal axis extending parallel to the interior sleeve, the seal ring being symmetrical about the longitudinal axis.

Exemplary claim 13: The seal ring of exemplary claim 11 wherein the seal retention feature comprises a groove.

Exemplary claim 14: The seal ring of exemplary claim 13 wherein the seal retention feature comprises a plurality of grooves.

Exemplary claim 15: The seal ring of exemplary claim 13 wherein the seal ring comprises a longitudinal axis extending parallel to the interior sleeve, the groove extending parallel to the longitudinal axis.

Exemplary claim 16: The seal ring of exemplary claim 11 wherein the seal retention feature comprises a lip.

Exemplary claim 17: The seal ring of exemplary claim 16 wherein the lip is arranged at one of an upper edge of the outer ring or a lower edge of the outer ring.

Exemplary claim 18: The seal ring of exemplary claim 16 wherein the seal retention feature comprises a plurality of lips.

Exemplary claim 19: The seal ring of exemplary claim 16 wherein the lip has an outer diameter which is greater than an outer diameter of the outer surface of the outer ring.

Exemplary claim 20: A method of assembling a fluid delivery system comprising a) providing a substrate block, the substrate block comprising an upper surface, a first substrate port in the upper surface, a second substrate port in the upper surface, a substrate fluid passageway extending between the first substrate port and the second substrate port, a substrate ring defining the second substrate port, and a substrate seal channel formed in the upper surface and surrounding the substrate ring, an outer surface of the substrate ring forming an inner surface of the substrate seal channel; b) inserting a seal ring into the first substrate port in the upper surface of the substrate block, the seal ring comprising an interior sleeve defining a sleeve fluid passageway and an outer ring, the outer ring connected to and surrounding the interior sleeve so that (1) an annular upper sleeve groove is formed between an upper portion of the outer ring and an upper portion of the interior sleeve and (2) an annular lower sleeve groove is formed between a lower portion of the outer ring and a lower portion of the interior sleeve, the outer ring comprising an inner surface, an outer surface, and a seal retention feature, the seal retention feature formed on the outer surface of the outer ring, the seal annular lower sleeve groove receiving the substrate ring of the first substrate port; and c) coupling an active component to the substrate block, the active component comprising a lower surface, a first component port in the lower surface, a component fluid passageway extending from the first component port, a component ring defining the first component port, and a component seal channel formed in the lower surface and surrounding the component ring, an outer surface of the component ring forming an inner surface of the component seal channel, the annular upper sleeve groove of the seal ring receiving the component ring of the active component.

Exemplary claim 21: The method of exemplary claim 20 wherein in step b), the seal retention feature comprises a groove that forms a passageway between an outer surface of the substrate seal channel and the outer ring of the seal ring.

Exemplary claim 22: The method of exemplary claim 21 wherein in step b-1), a liquid within the substrate seal channel is forced through the passageway formed by the groove and the outer surface of the substrate seal channel.

Exemplary claim 23: The method of exemplary claim 20 wherein in step b), the seal retention feature comprises a lip that engages an outer surface of the substrate seal channel.

Exemplary claim 24: The method of exemplary claim 23 wherein in step b-2), the lip deforms the outer surface of the substrate seal channel to form an undercut.

Exemplary claim 25: A fluid delivery system comprising a substrate block comprising an upper surface; a first substrate port in the upper surface; a second substrate port in the upper surface; a substrate fluid passageway extending between the first substrate port and the second substrate port; a substrate ring defining the second substrate port; a substrate seal channel formed in the upper surface and surrounding the substrate ring, an outer surface of the substrate ring forming an inner surface of the substrate seal channel; and a substrate seal retention feature formed on an outer surface of the substrate seal channel, the outer surface opposite the inner surface of the substrate seal channel. The fluid delivery system further comprising an active component comprising a lower surface; a first component port in the lower surface; a component fluid passageway extending from the first component port; a component ring defining the first component port; and a component seal channel formed in the lower surface and surrounding the component ring, an outer surface of the component ring forming an inner surface of the component seal channel. The fluid delivery system further comprising a seal ring comprising an interior sleeve defining a sleeve fluid passageway; and an outer ring connected to and surrounding the interior sleeve so that: (1) an annular upper sleeve groove is formed between an upper portion of the outer ring and an upper portion of the interior sleeve; and (2) an annular lower sleeve groove is formed between a lower portion of the outer ring and a lower portion of the interior sleeve. The active component mounted to the substrate block so that: (1) the second substrate port and the first component port are aligned; and (2) the seal ring nests in each of the substrate seal channel and the component seal channel and the seal ring fluidly seals the substrate fluid passageway and the component fluid passageway.

Exemplary claim 26: The fluid delivery system of exemplary claim 25 wherein the substrate seal retention feature comprises a groove.

Exemplary claim 27: The fluid delivery system of exemplary claim 26 wherein the substrate seal retention feature comprises a plurality of grooves.

Exemplary claim 28: The fluid delivery system of exemplary claim 26 wherein the seal ring comprises a longitudinal axis extending parallel to the interior sleeve, the groove extending parallel to the longitudinal axis.

Exemplary claim 29: The fluid delivery system of exemplary claim 25 wherein the substrate seal retention feature comprises a lip.

Exemplary claim 30: The fluid delivery system of exemplary claim 29 wherein the lip protrudes from the outer surface of the substrate seal channel.

Exemplary claim 31: The fluid delivery system of exemplary claim 29 wherein the lip has an inner diameter which is less than an outer diameter of the outer ring of the seal ring.

Exemplary claim 32: A method of assembling a fluid delivery system comprising a) providing a substrate block, the substrate block comprising an upper surface, a first substrate port in the upper surface, a second substrate port in the upper surface, a substrate fluid passageway extending between the first substrate port and the second substrate port, a substrate ring defining the second substrate port, a substrate seal channel formed in the upper surface and surrounding the substrate ring, an outer surface of the substrate ring forming an inner surface of the substrate seal channel, and a substrate seal retention feature formed on an outer surface of the substrate seal channel, the outer surface opposite the inner surface of the substrate seal channel; b) inserting a seal ring into the first substrate port in the upper surface of the substrate block, the seal ring comprising an interior sleeve defining a sleeve fluid passageway and an outer ring, the outer ring connected to and surrounding the interior sleeve so that (1) an annular upper sleeve groove is formed between an upper portion of the outer ring and an upper portion of the interior sleeve and (2) an annular lower sleeve groove is formed between a lower portion of the outer ring and a lower portion of the interior sleeve, the seal annular lower sleeve groove receiving the substrate ring of the first substrate port; c) coupling an active component to the substrate block, the active component comprising a lower surface, a first component port in the lower surface, a component fluid passageway extending from the first component port, a component ring defining the first component port, and a component seal channel formed in the lower surface and surrounding the component ring, an outer surface of the component ring forming an inner surface of the component seal channel, the annular upper sleeve groove of the seal ring receiving the component ring of the active component.

Exemplary claim 33: A seal ring, the seal ring comprising an interior sleeve defining a sleeve fluid passageway; an outer ring connected to and surrounding the interior sleeve so that: (1) an annular upper sleeve groove is formed between an upper portion of the outer ring and an upper portion of the interior sleeve; and (2) an annular lower sleeve groove is formed between a lower portion of the outer ring and a lower portion of the interior sleeve; and a web extending across the sleeve fluid passageway.

Exemplary claim 34: The seal ring of exemplary claim 33 wherein the seal ring comprises a longitudinal axis extending along the interior sleeve, the seal ring being symmetrical about the longitudinal axis.

Exemplary claim 35: The seal ring of exemplary claim 33 wherein the web is free of holes or passages.

Exemplary claim 36: The seal ring of exemplary claim 33 wherein the web prevents fluid flow through the sleeve fluid passageway.

Exemplary claim 37: The seal ring of exemplary claim 33 wherein the web comprises an aperture, the aperture having a smaller diameter than a diameter of the sleeve fluid passageway.

Exemplary claim 38: The seal ring of exemplary claim 33 wherein the web tapers toward a longitudinal axis, the longitudinal axis extending along the sleeve fluid passageway.

Exemplary claim 39: The seal ring of exemplary claim 33 wherein the web has a constant thickness.

Exemplary claim 40: The seal ring of exemplary claim 33 wherein the web has a maximum height which is less than a height of the interior sleeve.

Exemplary claim 41: The seal ring of exemplary claim 33 wherein the outer ring comprises a seal retention feature.

What is claimed is:

1. A fluid delivery system, comprising:
    a substrate block, comprising:
        an upper surface;
        a first substrate port in the upper surface;
        a second substrate port in the upper surface;
        a substrate fluid passageway extending between the first substrate port and the second substrate port;
        a substrate ring defining the second substrate port; and
        a substrate seal channel formed in the upper surface and surrounding the substrate ring, an outer surface of the substrate ring forming an inner surface of the substrate seal channel;
    an active component, comprising:
        a lower surface;
        a first component port in the lower surface;
        a component fluid passageway extending from the first component port;
        a component ring defining the first component port; and
        a component seal channel formed in the lower surface and surrounding the component ring, an outer surface of the component ring forming an inner surface of the component seal channel;
    a seal ring, comprising:
        an interior sleeve defining a sleeve fluid passageway; and
        an outer ring connected to and surrounding the interior sleeve so that: (1) an annular upper sleeve groove is formed between an upper portion of the outer ring and an upper portion of the interior sleeve; and (2) an annular lower sleeve groove is formed between a lower portion of the outer ring and a lower portion of the interior sleeve, the outer ring comprising an inner surface, an outer surface, and a seal retention feature, the seal retention feature formed on the outer surface of the outer ring, and the inner surface comprising a first mating surface engaged with the substrate block and a second mating surface configured engaged with the active component; and
    the active component mounted to the substrate block so that: (1) the second substrate port and the first component port are aligned; and (2) the seal ring nests in each of the substrate seal channel and the component seal channel and the seal ring fluidly seals the substrate fluid passageway and the component fluid passageway, wherein the seal retention feature comprises a groove, and wherein the seal ring comprises a longitudinal axis extending parallel to the interior sleeve, wherein the groove is defined in the outer surface of the outer ring and is outwardly-facing, the outwardly-facing groove extending parallel to the longitudinal axis.

2. A fluid delivery system, comprising:

a substrate block, comprising:
  an upper surface;
  a first substrate port in the upper surface;
  a second substrate port in the upper surface;
  a substrate fluid passageway extending between the first substrate port and the second substrate port;
  a substrate ring defining the second substrate port; and
  a substrate seal channel formed in the upper surface and surrounding the substrate ring, an outer surface of the substrate ring forming an inner surface of the substrate seal channel;

an active component, comprising:
  a lower surface;
  a first component port in the lower surface;
  a component fluid passageway extending from the first component port;
  a component ring defining the first component port; and
  a component seal channel formed in the lower surface and surrounding the component ring, an outer surface of the component ring forming an inner surface of the component seal channel;

a seal ring, comprising:
  an interior sleeve defining a sleeve fluid passageway; and
  an outer ring connected to and surrounding the interior sleeve so that: (1) an annular upper sleeve groove is formed between an upper portion of the outer ring and an upper portion of the interior sleeve; and (2) an annular lower sleeve groove is formed between a lower portion of the outer ring and a lower portion of the interior sleeve, the outer ring comprising an inner surface, an outer surface, and a seal retention feature, the seal retention feature formed on the outer surface of the outer ring, and the inner surface comprising a first mating surface engaged with the substrate block and a second mating surface configured engaged with the active component; and the active component mounted to the substrate block so that: (1) the second substrate port and the first component port are aligned; and (2) the seal ring nests in each of the substrate seal channel and the component seal channel and the seal ring fluidly seals the substrate fluid passageway and the component fluid passageway, wherein the seal retention feature comprises a lip, and wherein the outer ring comprises an upper face and a lower face positioned opposite the upper face, and wherein the lip is arranged at one of an upper edge of the upper face or a lower edge of the lower face.

3. The fluid delivery system of claim 2 wherein the seal ring comprises a longitudinal axis extending parallel to the interior sleeve, the seal ring being symmetrical about the longitudinal axis.

4. The fluid delivery system of claim 2 wherein the lip has an outer diameter which is greater than an outer diameter of the outer surface of the outer ring.

5. The fluid delivery system of claim 4 wherein the outer diameter of the lip is greater than an outer diameter of an outer surface of the substrate seal channel.

6. The fluid delivery system of claim 2 wherein the lip extends toward the interior sleeve.

7. A seal ring positionable intermediate a substrate block and an active component of a fluid delivery system, the seal ring comprising:
  an interior sleeve defining a sleeve fluid passageway; and
  an outer ring connected to and surrounding the interior sleeve so that: (1) an annular upper sleeve groove is formed between an upper portion of the outer ring and an upper portion of the interior sleeve; and (2) an annular lower sleeve groove is formed between a lower portion of the outer ring and a lower portion of the interior sleeve, the outer ring comprising an inner surface, an outer surface, and a seal retention feature, the seal retention feature formed on the outer surface of the outer ring, and the inner surface comprising a first mating surface configured to engage the substrate block and a second mating surface configured to engage the active component, wherein the seal retention feature comprises a groove, and wherein the seal ring comprises a longitudinal axis extending parallel to the interior sleeve, wherein the groove is defined in the outer surface of the outer ring and is outwardly-facing, the outwardly-facing groove extending parallel to the longitudinal axis.

8. A seal ring positionable intermediate a substrate block and an active component of a fluid delivery system, the seal ring comprising:
  an interior sleeve defining a sleeve fluid passageway; and
  an outer ring connected to and surrounding the interior sleeve so that: (1) an annular upper sleeve groove is formed between an upper portion of the outer ring and an upper portion of the interior sleeve; and (2) an annular lower sleeve groove is formed between a lower portion of the outer ring and a lower portion of the interior sleeve, the outer ring comprising an inner surface, an outer surface, and a seal retention feature, the seal retention feature formed on the outer surface of the outer ring, and the inner surface comprising a first mating surface configured to engage the substrate block and a second mating surface configured to engage the active component, wherein the seal retention feature comprises a lip, and wherein the outer ring comprises an upper face and a lower face positioned opposite the upper face, and wherein the lip is arranged at one of an upper edge of the upper face or a lower edge of the lower face.

9. The seal ring of claim 8 wherein the seal ring comprises a longitudinal axis extending parallel to the interior sleeve, the seal ring being symmetrical about the longitudinal axis.

10. The seal ring of claim 8 wherein the lip has an outer diameter which is greater than an outer diameter of the outer surface of the outer ring.

11. The seal ring of claim 8 wherein the lip extends toward the interior sleeve.

12. A method of assembling a fluid delivery system comprising:
  a) providing a substrate block, the substrate block comprising an upper surface, a first substrate port in the upper surface, a second substrate port in the upper surface, a substrate fluid passageway extending between the first substrate port and the second substrate port, a substrate ring defining the second substrate port, and a substrate seal channel formed in the upper surface and surrounding the substrate ring, an outer surface of the substrate ring forming an inner surface of the substrate seal channel;

b) inserting a seal ring into the first substrate port in the upper surface of the substrate block, the seal ring comprising an interior sleeve defining a sleeve fluid passageway and an outer ring, the outer ring connected to and surrounding the interior sleeve so that (1) an annular upper sleeve groove is formed between an upper portion of the outer ring and an upper portion of the interior sleeve and (2) an annular lower sleeve groove is formed between a lower portion of the outer ring and a lower portion of the interior sleeve, the outer ring comprising an inner surface, an outer surface, and a seal retention feature, the seal retention feature formed on the outer surface of the outer ring, the seal annular lower sleeve groove receiving the substrate ring of the first substrate port, the inner surface of the outer ring comprising a first mating surface engaged with the substrate block; and c) coupling an active component to the substrate block, the active component comprising a lower surface, a first component port in the lower surface, a component fluid passageway extending from the first component port, a component ring defining the first component port, and a component seal channel formed in the lower surface and surrounding the component ring, an outer surface of the component ring forming an inner surface of the component seal channel, the annular upper sleeve groove of the seal ring receiving the component ring of the active component, the inner surface of the outer ring comprising a second mating surface engaged with the active component, wherein the seal retention feature comprises a groove, wherein the seal ring comprises a longitudinal axis extending parallel to the interior sleeve, and wherein the groove is defined in the outer surface of the outer ring and is outwardly-facing, the outwardly-facing groove extending parallel to the longitudinal axis.

\* \* \* \* \*